US011417402B2

(12) United States Patent
Shin

(10) Patent No.: US 11,417,402 B2
(45) Date of Patent: Aug. 16, 2022

(54) STORAGE DEVICE AND OPERATING METHOD THEREOF

(71) Applicant: SK hynix Inc., Icheon-si (KR)

(72) Inventor: Dae Seok Shin, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/094,688

(22) Filed: Nov. 10, 2020

(65) Prior Publication Data

US 2021/0391019 A1 Dec. 16, 2021

(30) Foreign Application Priority Data

Jun. 12, 2020 (KR) .................... 10-2020-0071379

(51) Int. Cl.
  *G06F 3/06* (2006.01)
  *G11C 16/26* (2006.01)
  *G11C 16/16* (2006.01)
  *G11C 16/04* (2006.01)

(52) U.S. Cl.
  CPC ............ *G11C 16/26* (2013.01); *G06F 3/0625* (2013.01); *G06F 3/0644* (2013.01); *G06F 3/0653* (2013.01); *G06F 3/0655* (2013.01); *G06F 3/0679* (2013.01); *G11C 16/16* (2013.01); *G11C 16/0483* (2013.01)

(58) Field of Classification Search
  CPC ..... G11C 16/26; G11C 16/16; G11C 16/0483; G11C 3/0625; G11C 3/0644; G11C 3/0653; G11C 3/0655; G11C 3/0679
  See application file for complete search history.

(56) References Cited

U.S. PATENT DOCUMENTS

| 10,977,186 | B2 * | 4/2021 | Srinivasan | .......... G06F 11/0793 |
| 2015/0103599 | A1 * | 4/2015 | Kim | ........................ G11C 16/26 |
| | | | | 365/185.12 |
| 2017/0337972 | A1 * | 11/2017 | Lee | .......................... G11C 16/08 |
| 2018/0321873 | A1 * | 11/2018 | Liu | ............................ G11C 16/10 |
| 2019/0347198 | A1 * | 11/2019 | Hsieh | .................... G06F 12/0253 |
| 2020/0065029 | A1 * | 2/2020 | Kim | ........................ G06F 3/0625 |
| 2020/0341870 | A1 * | 10/2020 | Frolikov | ................ G06F 3/0619 |
| 2020/0348880 | A1 * | 11/2020 | Eliash | .................... G06F 3/0659 |
| 2020/0371716 | A1 * | 11/2020 | Hsieh | .................... G06F 3/0659 |

FOREIGN PATENT DOCUMENTS

| KR | 10-2017-0130657 A | 11/2017 |
| KR | 10-2018-0008951 A | 1/2018 |

* cited by examiner

*Primary Examiner* — Hiep T Nguyen
(74) *Attorney, Agent, or Firm* — Perkins Coie LLP

(57) ABSTRACT

A storage device having an improved operation speed includes memory blocks and a sudden power-off manager. The memory blocks connected to word lines as part of a super block. The sudden power-off manager in communication with the memory blocks and configured to, in response to a sudden power off, 1) select reference word lines among the word lines to group the word lines into word line zones defined using the reference word lines, 2) perform read operations on pages connected to the reference word lines to determine states of the pages connected to the reference word lines, 3) select a first erase page search zone among the word line zones based on results of the read operations, and 4) determine a first erase page located at a boundary between a program page and an erase page in the first erase page search zone.

20 Claims, 22 Drawing Sheets

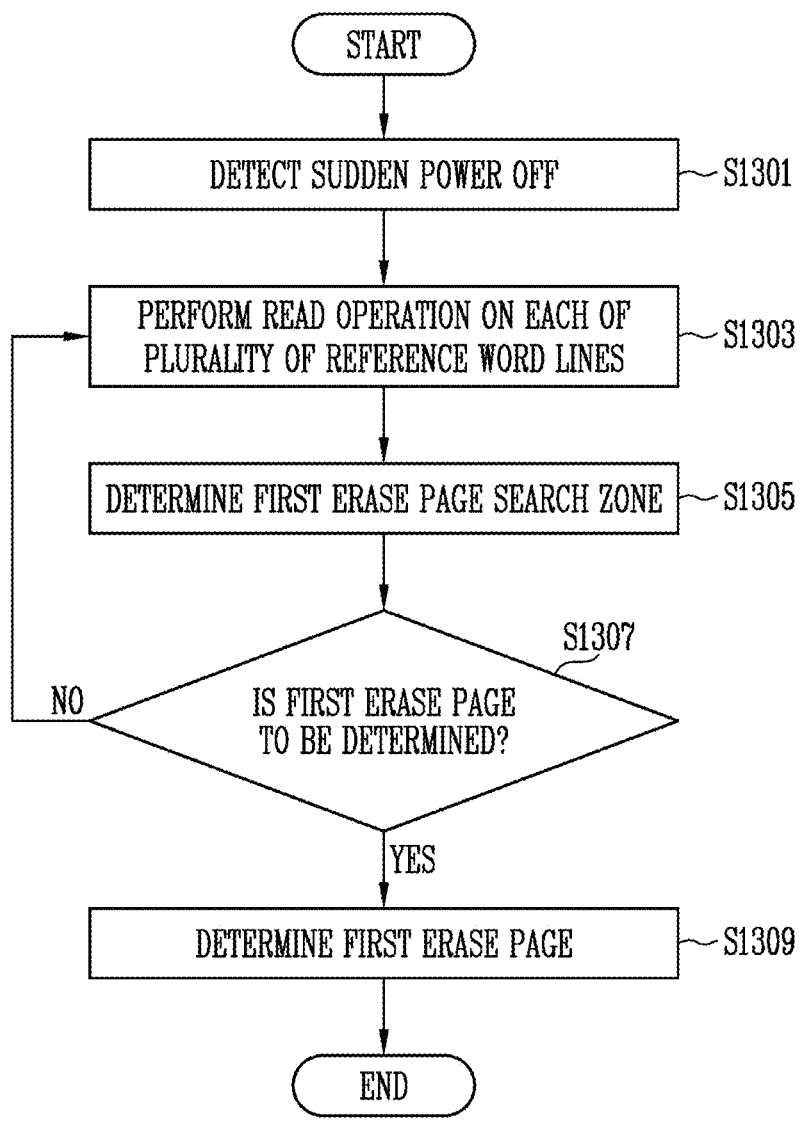

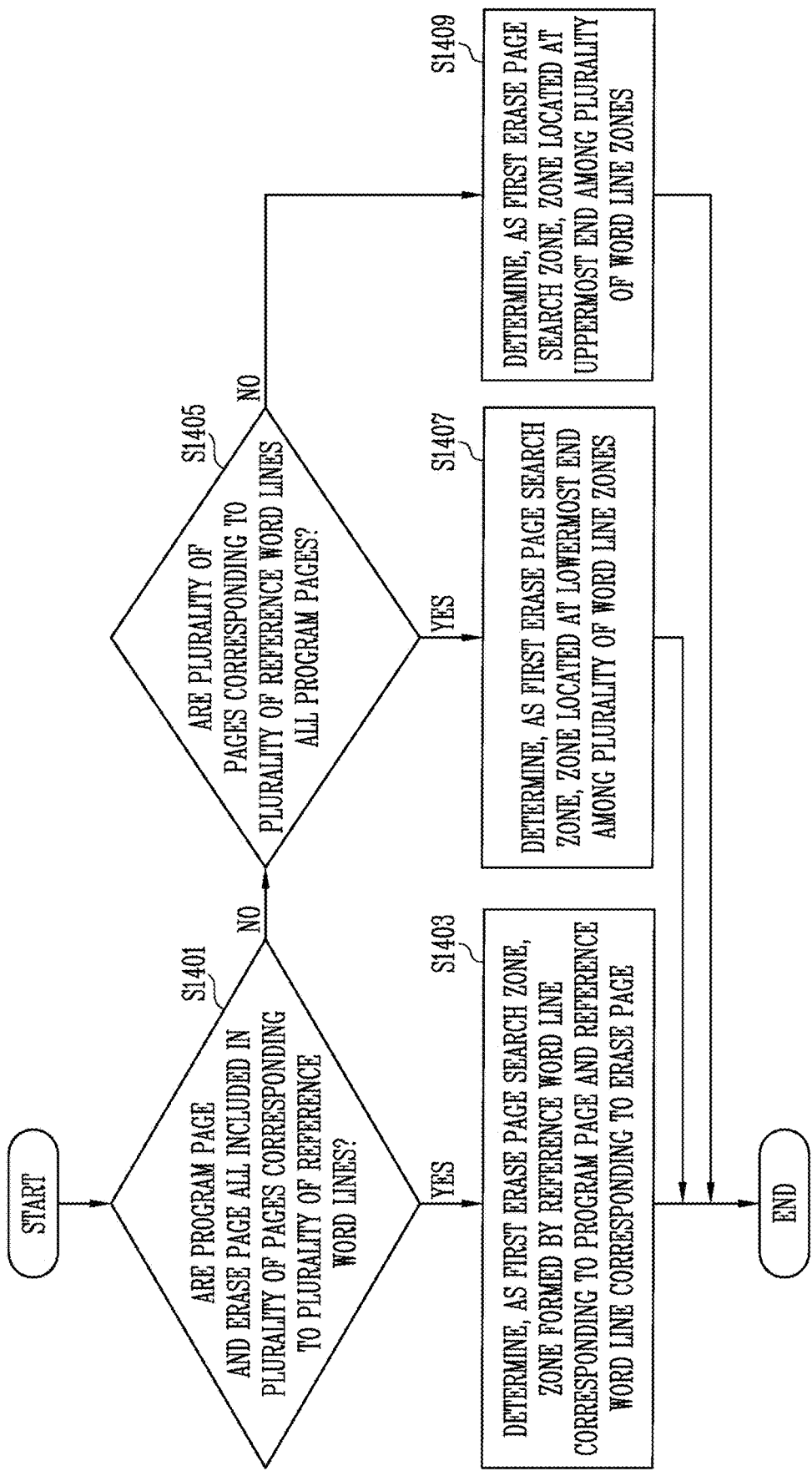

STORAGE DEVICE AND OPERATING METHOD THEREOF

CROSS-REFERENCE TO RELATED APPLICATION

This patent document claims priority to and benefits of the Korean patent application number 10-2020-0071379, filed on Jun. 12, 2020, which is incorporated herein by reference in its entirety.

TECHNICAL FIELD

Various implementations of the disclosed technology generally relates to an electronic device, and more particularly, to a storage device and an operating method thereof.

BACKGROUND

Storage devices refer to electronic components that are configured to store data under on a permanent or temporary basis. Each storage device may include one or more storage medium to store data and operate based on a request from a host device. Examples of the host device include a computer, a smart phone, a smart pad, or other various electronic devices. The storage device may include a storage medium for storing data and may further include a memory controller for controlling the storage medium to store or retrieve data. The storage device can be classified based on the type of storage medium. For example, the memory device used as a storage medium is classified into a volatile memory device and a nonvolatile memory device.

A volatile memory device is a memory device that can retain its data only when power is supplied. Thus, such a volatile memory device loses its data in the absence of power. Examples of the volatile memory device includes a Static Random Access Memory (SRAM), or a Dynamic Random Access Memory (DRAM).

A nonvolatile memory device is a memory device that can retain its data even in the absence of power. Examples of the nonvolatile memory device include a Read Only Memory (ROM), a Programmable ROM (PROM), an Electrically Programmable ROM (EPROM), an Electrically Erasable ROM (EEROM), or a flash memory.

SUMMARY

Embodiments provide a storage device having an improved operation speed and an operating method thereof.

In one aspect, a storage device is provided to include: a plurality of memory blocks connected to a plurality of word lines, the plurality of memory blocks being included in a super block; and a sudden power-off manager configured to control the plurality of memory blocks to perform a read operation on each of a plurality of reference word lines which become a reference for dividing the plurality of word lines into a plurality of word line zones in the plurality of memory blocks, when sudden power off occurs, determine a first erase page search zone including a word line corresponding to a first erase page located at a boundary between a program page and an erase page among the plurality of word line zones, and perform an erase page search operation of determining the first erase page in the first erase page search zone.

In accordance with an aspect of the disclosed technology, there is provided a storage device including: a plurality of memory blocks that is included in a super block and connected to a plurality of word lines; and a sudden power-off manager in communication with the plurality of memory blocks and configured to, in response to a sudden power off, 1) select reference word lines among the plurality of word lines to group the plurality of word lines into a plurality of word line zones defined using the reference word lines, 2) perform read operations on pages connected to the reference word lines to determine states of the pages connected to the reference word lines, 3) select a first erase page search zone among the plurality of word line zones based on results of the read operations, and 4) determine a first erase page located at a boundary between a program page and an erase page in the first erase page search zone.

In another aspect, a memory controller for controlling an operation of a super block including a plurality of memory blocks connected to a plurality of word lines is provided. The memory controller comprises: a sudden power-off controller configured to control the plurality of memory blocks to perform a read operation on each of a plurality of reference word lines which become a reference for dividing the plurality of word lines into a plurality of word line zones in the plurality of memory blocks, when sudden power off occurs, determine a first erase page search zone including a word line corresponding to a first erase page located at a boundary between a program page and an erase page among the plurality of word line zones, and perform an erase page search operation of determining the first erase page in the first erase page search zone; and a sudden power-off state register configured to store sudden power-off state information associated with the sudden power off.

In accordance with another aspect of the disclosed technology, there is provided a memory controller for controlling a memory device including a plurality of memory blocks that is included in a super block and connected to a plurality of word lines, the memory controller including: a sudden power-off controller in communication with the plurality of memory blocks and configured to, in response to a sudden power off, 1) select reference word lines among the plurality of word lines to group the plurality of word lines into a plurality of word line zones that are defined using the reference word lines, 2) perform read operations on pages included in the plurality of memory blocks and connected to the reference word lines to determine states of the pages, 3) select a first erase page search zone among the plurality of word line zones based on results of the read operations, and 4) determine a first erase page located at a boundary between a program page and an erase page in the first erase page search zone; and a sudden power-off state register coupled to and in communication with the sudden power-off controller and configured to store sudden power-off state information associated with the sudden power off.

In another aspect, a method for operating a storage device for controlling an operation of a super block including a plurality of memory blocks connected to a plurality of word lines. The method comprises: detecting sudden power-off; performing a read operation on each of a plurality of reference word lines which become a reference for dividing the plurality of word lines into a plurality of word line zones in the plurality of memory blocks; determining a first erase page search zone including a word line corresponding to a first erase page located at a boundary between a program page and an erase page among the plurality of word line zones; and determining the first erase page in the first erase page search zone.

In accordance with still another aspect of the disclosed technology, there is provided a method for operating a storage device that controls an operation of a super block including a plurality of memory blocks connected to a plurality of word lines. The method includes: detecting an occurrence of sudden power-off that interrupts a supply of power to the storage device; selecting reference word lines among the plurality of word lines to group the plurality of word lines into word line zones that are defined using the reference word lines; performing read operations on pages connected to the reference word lines to determine a states of each of the pages connected to the reference word lines as a erase state or a program state; selecting a first erase page search zone among the word line zones; and determining a first erase page located at a boundary between a program page and an erase page in the first erase page search zone.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 13 is a flowchart illustrating an operating method of a storage device in accordance with an embodiment of the disclosed technology.

FIG. 14 is a flowchart illustrating a method for determining a first erase page search zone in accordance with an embodiment of the disclosed technology.

DETAILED DESCRIPTION

The specific structural or functional description disclosed herein is merely illustrative for the purpose of describing embodiments according to the concept of the disclosed technology. The embodiments according to the concept of the disclosed technology can be implemented in various forms, and cannot be construed as limited to the embodiments set forth herein.

Figure 1:
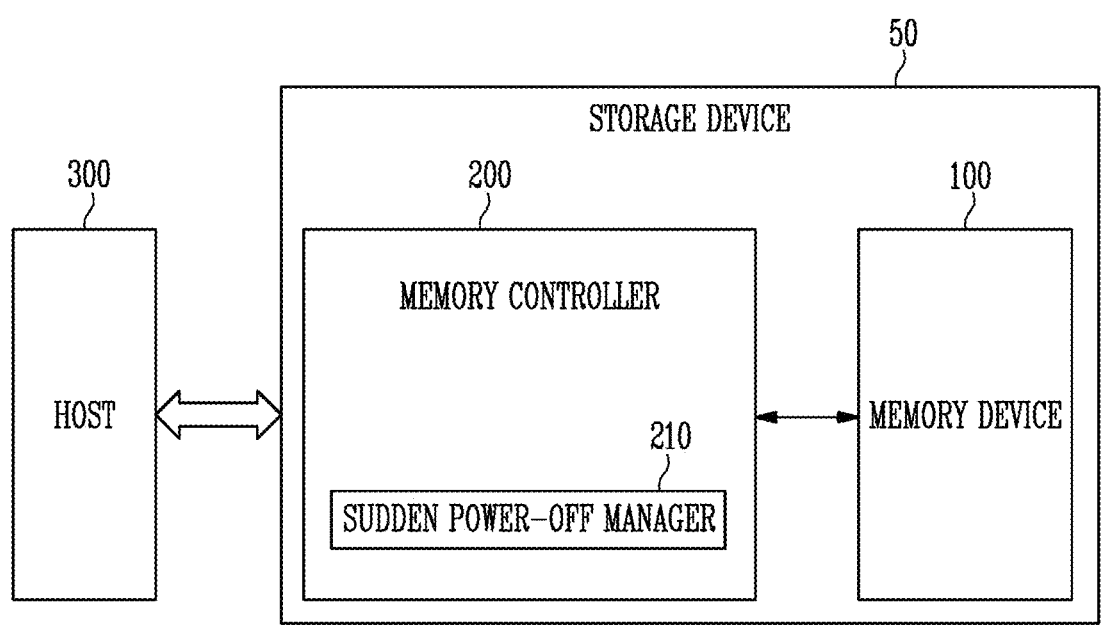
FIG. 1 is a diagram illustrating a storage device in accordance with an embodiment of the disclosed technology.

FIG. 1 is a diagram illustrating a storage device in accordance with an embodiment of the disclosed technology.

Referring to FIG. 1, the storage device 50 may include a memory device 100 and a memory controller 200 for controlling an operation of the memory device 100. The storage device 50 may be used to store and retrieve data according to requests from a host 300, such as a mobile phone, a smart phone, an MP3 player, a laptop computer, a desktop computer, a game console, a TV, a tablet PC or an in-vehicle infotainment system.

The storage device 50 may be manufactured as any one of various types of storage devices according to a host interface that is a communication interface between the host 300 and the storage device 50. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, or others.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), or a Wafer-level Stack Package (WSP).

The memory device 100 may provide a storage space where data to be processed and/or instructions to be executed are stored. The memory device 100 may include the logic needed to read from and write to the memory device 100 and be operated in response to requests from the memory controller 200. The memory device 100 may include a memory cell array (not shown) including a plurality of memory cells which are configured to store data therein.

Each of the memory cells may operate in various manners to store data. In some implementations, the memory cells can store a single bit or more bits of information. In some implementations, the memory cells may operate as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of pages, and each pages corresponds to a plurality of memory cells. One memory block may include a plurality of pages. In an embodiment of the disclosed technology, read and program (write) operations are performed on a page basis, and erase operations are performed on a block basis.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or others. In this patent document, for convenience of description, a description will be made on the assumption that the memory device 100 is a NAND flash memory.

The memory controller 200 can access the memory device 100 based on requests form the user/host by providing command/address signals to the memory controller 200. In some implementations, the memory device 100 may receive, from the memory controller 200, a command CMD and an address ADDR in which the command CMD is performed or executed, and access a zone of the memory device 100 selected by the address ADDR. The memory device 100 may perform an operation indicated by the command CMD on the zone selected by the address ADDR. For example, the memory device 100 may perform a write operation (program operation), a read operation, and an erase operation. In the program operation, data is written to the zone (e.g., memory cell area) of the memory device 100, which is identified by the address ADDR. In the read operation, data is read from the zone of the memory device 100, which is identified by the address ADDR. In the erase operation, data is erased from the zone of the memory device 100, which is identified by the address ADDR.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300, and translate the LBA into a Physical Block Address (PBA) representing where the memory cells to write data to or read data from are in the memory device 100. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or others, based on a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control more than one memory device 100 at the same time. The memory controller 200 may control the memory devices according to an interleaving technique so as to improve operational performance. The interleaving technique may improve system performance by performing more than one operation at a given time frame. For example, the interleaving scheme may perform operations on two or more memory devices 100 at the same time by interleaving a part of a queue associated with a memory device with a part of another queue associated with another memory device.

In an embodiment, the memory controller 200 may include a sudden power-off manager 210.

When sudden power off occurs, the sudden power-off manager 210 detects the occurrence of the sudden power off, and perform a sudden power-off recovery operation.

The sudden power-off recovery operation may be or include an operation to identify a page on which a program operation has been performed before the occurrence of the sudden power-off, and another operation to continuously perform that program operation.

For example, sudden power off may occur while the memory device 100 is performing the program operation. The sudden power off may occur when power supplied to the storage device 500 is suddenly or unexpectedly interrupted. When the storage device 50 is supplied with power again after the occurrence of the sudden power off, the sudden power-off manager 210 may perform the sudden power-off recovery operation.

The sudden power-off manager 210 may determine a page to which data is written during the program operation when sudden power off occurs. Thus, the sudden power-off manager 210 may determine a program state or an erase state of each page included in a memory block. The sudden power-off manager 210 may search for a first erase page. An erase page refers to a page that is empty without any data stored therein or with erase data only and a program page refers to a page including program data. The first erase page may correspond to an erase page that is one of erase pages and adjacent to a program page in which data is stored. To search for the first erase page, the sudden power-off manager 210 may perform a read operation on some pages among the pages included in the corresponding memory block.

In some implementations, the sudden power-off manager 210 may control the memory device 100 to perform a read operation on a specific page included in a memory block. When data read from the read operation includes program data, the corresponding page may be determined as a program page. When the data read from the read operation includes only erase data, the corresponding page may be determined as an erase page.

When sudden power off occurs, the sudden power-off manager 210 may control a plurality of memory blocks included in a super block to perform a read operation. The read operation may be performed on each of a plurality of reference word lines that are used to divide a plurality of word lines connected to the plurality of memory blocks into a plurality of word line zones. In some implementations, performing the read operation on a word line may include performing the read operation using the word line, for example, by applying a read voltage to the word line.

In an embodiment, the sudden power-off manager 210 may control the plurality of memory blocks to perform read operations on different reference word lines among the plurality of reference word lines in each of the plurality of memory blocks. The sudden power-off manager 210 may control the plurality of memory blocks to perform in parallel read operations on different reference word lines in each of the plurality of memory blocks by using an interleaving technique.

An operation of controlling a plurality of memory blocks to perform a read operation on each of a plurality of reference word lines in parallel will be described in detail with reference to FIG. 5 which will be described later.

Also, the sudden power-off manager 210 may determine a first erase page search zone including a word line corresponding to a first erase page located at a boundary between a program page and an erase page. The first erase page search zone may be one of a plurality of word line zones.

The first erase page search zone may be a zone for performing an erase page search operation. For example, the first erase page search zone may include at least one word line.

In some implementations, the sudden power-off manager 210 may determine a state of pages corresponding to a plurality of reference word lines, based on read data of the plurality of reference word lines, and determine a first erase page search zone among the plurality word line zones, based on the determined state of the pages. The determined state of the pages may be one of a program state and an erase state. An operation of determining the first erase page search zone will be described in detail with reference to FIGS. 5, 7, and 8 which will be described later.

The sudden power-off manager 210 may determines a first erase page among a plurality of pages included in a plurality of memory blocks in the first erase page search zone.

In some implementations, the sudden power-off manager 210 may control the plurality of memory blocks to perform a read operation on at least one word line included in the first erase page search zone. The sudden power-off manager 210 may determine a state of pages corresponding to the at least one word line included in the first erase page search zone, based on read data of the at least one word line included in the first erase page search zone, and determine a first erase page, based on the determined state of the pages.

In an embodiment, when a first word line corresponding to the program page and a second word line corresponding to the erase page are adjacent to each other, the sudden power-off manager 210 may determine, as a first erase page, a page corresponding to the second word line. In this case, the first word line and the second word lines are among the plurality of word lines included in the first erase page search zone. An operation of determining the first erase page will be described in detail with reference to FIG. 6 which will be described later.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), or a Load Reduced DIMM (LRDIMM).

Figure 2:
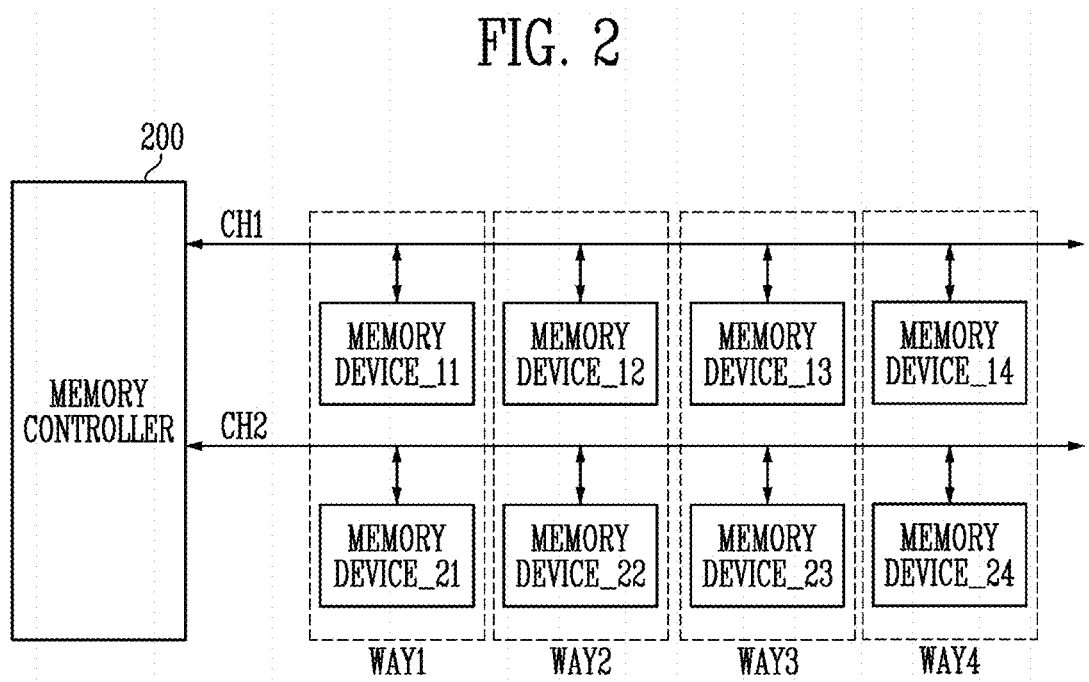
FIG. 2 is a diagram exemplarily illustrating a connection relationship between a memory controller shown in FIG. 1 and a plurality of memory devices.

FIG. 2 is a diagram exemplarily illustrating a connection relationship between the memory controller shown in FIG. 1 and a plurality of memory devices.

Referring to FIG. 2, the memory controller 200 may be connected to a plurality of memory devices (memory device_11 to memory device_24) through a plurality of channels CH1 and CH2. one of ordinary skilled in the art can understand that the number of channels or the number of memory devices connected to each channel can be modified to various numbers. In the present example, it is assumed that the memory controller 200 is connected to memory devices through two channels, and four memory devices are connected to each channel.

For convenience of description, an operation of memory device_11, memory device_12, memory device_13, and memory device_14, which are connected to a first channel CH1, will be described. It will be understood that memory devices (memory device_21 to memory device_24) connected to the other channel CH2 are also operated like the memory device_11, the memory device_12, the memory device_13, and the memory device_14.

The memory device_11 to the memory device_14 may be commonly connected to the first channel CH1. The memory device_11 to the memory device_14 may communicate with the memory controller 200 through the first channel CH1. Since the memory device_11 to the memory device_14 are commonly connected through the first channel CH1, only one memory device may communicate with the memory controller 200 at one time. However, operations internally performed by each of the memory device_11 to the memory device_14 may be simultaneously performed.

The storage device using a plurality of memory devices can improve performance by using the interleaving technique described in FIG. 1. For the purpose of the interleaving technique, the memory devices may be managed in a channel and way unit. In order to maximize the parallelization of memory devices connected to each channel, the memory controller 200 may distribute and allocate a continuous logical memory zone in the channel and way unit.

For example, the memory controller 200 may transmit a command, a control signal including an address, and data to the memory device_11 through the first channel CH1. While the memory device_11 is programming the received data in a memory cell included therein, the memory controller may transmit a command, a control signal including an address, and data to the memory device_12.

In FIG. 2, the plurality of memory devices may constitute four ways WAY1 to WAY2. A first way WAY1 may include the memory device_11 and the memory device_21. A second way WAY2 may include the memory device_12 and the memory device_22. A third way WAY3 may include the memory device_13 and the memory device_23. A fourth way WAY4 may include the memory device_14 and the memory device_24.

Each of the channels CH1 and CH2 may be a bus of signals which share and use memory devices connected to the corresponding channel.

Although interleaving in a 2-channel/4-way structure has been described in FIG. 2, the interleaving may become more efficiency as a number of channels becomes larger and as a number of ways becomes larger.

Figure 3:
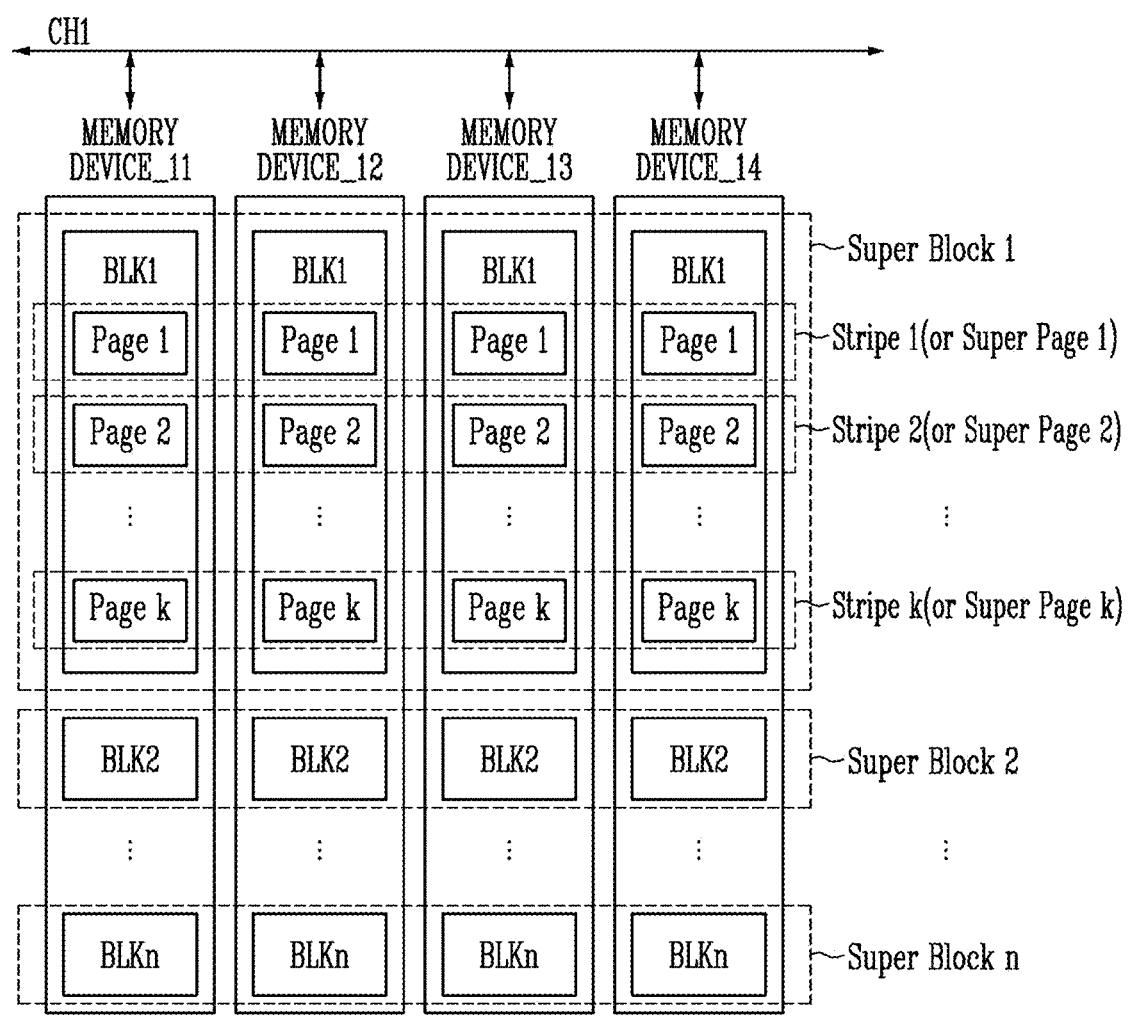
FIG. 3 is a diagram illustrating concepts of a super block, a super page, or a stripe.

FIG. 3 is a diagram illustrating concepts of a super block, a super page, or a stripe.

Referring to FIG. 3, four memory devices, i.e., the memory device_11 to the memory device_14 may be commonly connected to the first channel CH1.

In FIG. 3, each memory device may include a plurality of planes. However, for convenience of description, a case where one memory device includes one plane is assumed in this specification. One plane included in each of the memory devices (the memory device_11 to the memory device_14) may include first to nth memory blocks BLK1 to BLKn, and one memory block may include first to kth pages Page 1 to Page k.

The memory controller 200 may control, in a super block unit, memory blocks including a plurality of memory devices commonly connected to one channel. For example, the first memory blocks BLK1 included in the memory device_11 to the memory device_14 may constitute a first super block Super Block 1. Therefore, the memory device_11 to the memory device_14 connected to the first channel CH1 may include first to nth super blocks Super Block 1 to Super Block n.

One super block may be configured with a plurality of stripes, Stripe. The stripe, Stripe, may be used together with the term "super page."

One stripe or super page may include a plurality of pages. For example, the first pages Page 1 respectively included in the plurality of first memory blocks BLK1 included in the first super block Super Block 1 may constitute a first stripe Stripe 1 or a first super page Super Page 1.

Therefore, first to kth stripes, Stripe 1 to Stripe k, may be included in one super block. Alternatively, first to kth super pages Super Page 1 to Super Page k may be included in one super block.

When data are stored in the memory device_11 to the memory device_14 or when the data stored in the memory device_11 to the memory device_14 are read, the memory controller 200 may store or read the data in a strip unit or in a super page unit.

In an embodiment, in the memory controller 200, pages corresponding to a low numeral among first to kth stripes Stripe 1 to Stripe k included in a super block may be programmed.

For example, the memory controller 200 may store data in a plurality of first pages Page 1 included in the first stripe Stripe 1. Subsequently, when any space in which data is to be stored does not exist in the plurality of first pages Page 1, the memory controller 200 may store the data in a plurality of second pages included in a plurality of first memory blocks. Therefore, the controller 200 may sequentially store data from the first to kth stripes Stripe 1 to Stripe k included in the super block through the above-described manner.

Figure 4:
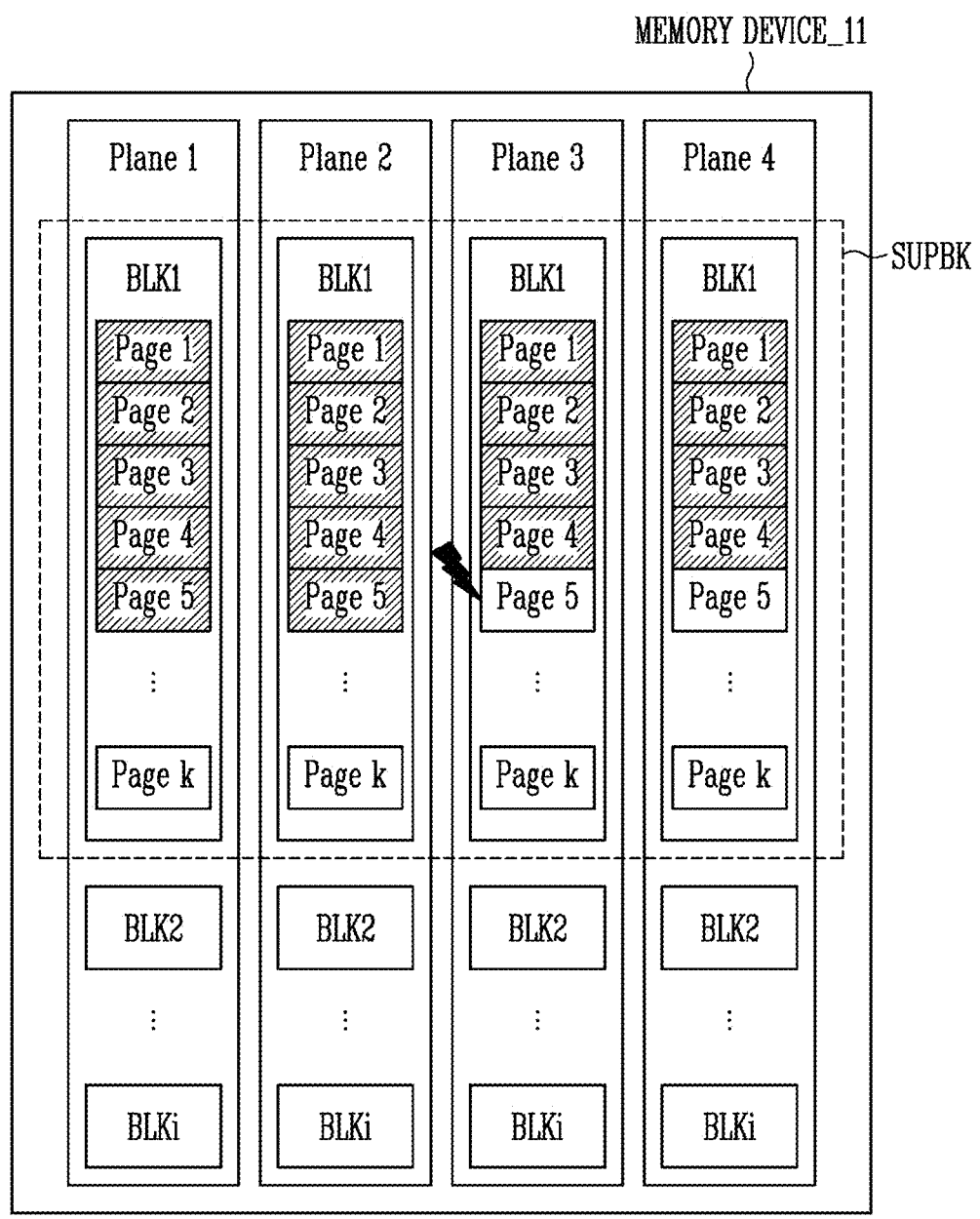
FIG. 4 is a diagram illustrating another embodiment of the super block shown in FIG. 3.

FIG. 4 is a diagram illustrating another embodiment of the super block shown in FIG. 3.

Referring to FIG. 4, memory device_11 represents the memory device_11 among the plurality of memory devices (the memory device_11 to the memory device_14) described with reference to FIG. 2.

The memory device_11 may include a plurality of planes, Plane 1 to Plane 4. One plane may include a plurality of memory blocks BLK1 to BLKi (i is a positive integer). Although a case where the memory device_11 includes four planes has been described in FIG. 4, the number of planes included in one memory device is not limited to the embodiment shown in FIG. 4.

The plane may be a unit for independently performing a program operation, a read operation, or an erase operation. Therefore, the memory device_11 may include, for each plane, an address decoder 120 and a read/write circuit (not shown), which will be described later.

In an embodiment, a super block SUPBK may include at least two memory blocks included in different planes among memory blocks respectively included in a plurality of planes included in one memory device. The memory device_11 which stores data in a super block SUPBK unit may simultaneously perform an operation on the plurality of planes, Plane 1 to Plane 4 (Multi-Plane Operation).

Sudden power-off may occur while data is sequentially being stored by the storage device 50 in a plurality of pages, Page 1 to Page k, included in a super block. The storage device 50 may perform a sudden power-off recovery operation through the sudden power-off manager 210 included in the memory controller 200.

In a conventional art, a first erase page is searched by using a binary search method. The binary search method searches for a first erase page while binarizing a plurality of word lines. However, in the binary search method, the speed of an erase page search operation becomes slower as a number of word lines included in a memory block becomes larger.

In order to solve this problem, the storage device 50 in accordance with the embodiment of the disclosed technology uses a binary method while performing a read operation for erase page search in each of the plurality of memory blocks. This will be described in detail with reference to FIGS. 5 to 8.

Figure 5:
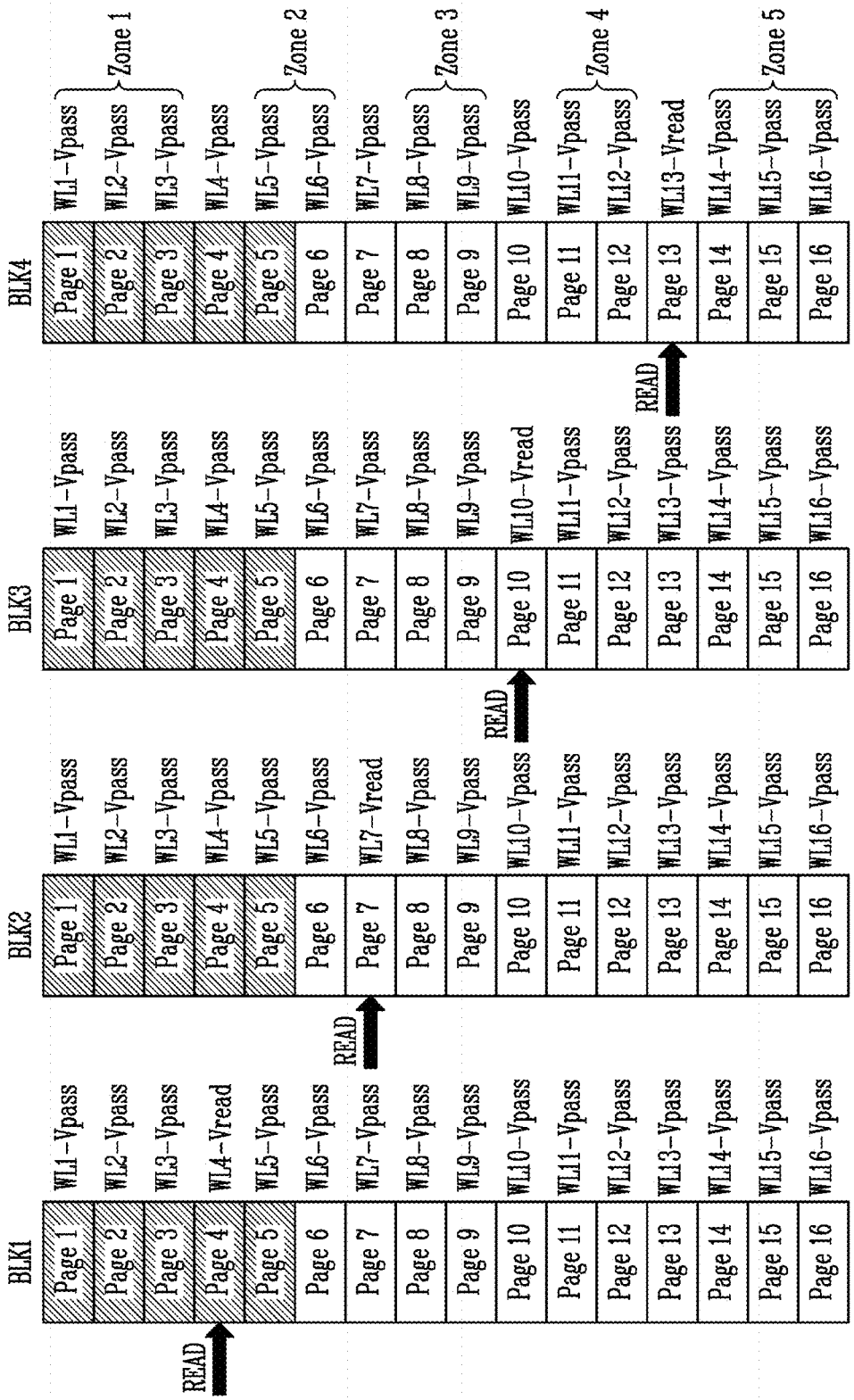
FIG. 5 is a diagram illustrating an example of determining a first erase page search zone in accordance with an embodiment of the disclosed technology.

FIG. 5 is a diagram illustrating an example of determining a first erase page search zone in accordance with an embodiment of the disclosed technology.

In FIG. 5, it is assumed that one super block includes four memory blocks BLK1 to BLK4 connected to 16 word lines WL1 to WL16, and each memory block includes 16 pages Page 1 to Page 16. However, such numbers, e.g., the number of each of the word lines, memory blocks, and the pages are examples only, and other implementations are also possible.

In FIG. 5, it is assumed that first to fifth pages Page 1 to Page 5 included in each of the memory blocks BLK1 to BLK4 are program pages, and sixth to sixteenth pages Page 6 to Page 16 are erase pages.

Referring to FIG. 5, the sudden power-off manager 210 may determine a plurality of reference word lines which become a reference for dividing a plurality of word lines into a plurality of word line zones. The word line zone means a zone including at least one word line.

In some implementations, the sudden power-off manager 210 may determine reference word lines to minimize an erase page search operation. For example, the sudden power-off manager 210 may determine a plurality of reference word lines such that the numbers of word lines included in the respective word line zones are same as one another.

In an embodiment, the plurality of reference word lines may be determined as word lines such that differences between the numbers of word lines included in the respective word line zones become smallest.

For example, numbers of word lines included in the respective word line zones may not be same depending on a number of word lines connected to a plurality of memory blocks. In some implementations, the sudden power-off manager 210 may determine a plurality of reference word lines such that differences between the numbers of word lines included in the respective word line zones become smallest.

For example, the sudden power-off manager 210 may determine, as a fourth word line WL4, a reference word line on which a read operation is to be performed in a first memory block BLK1, determine, as a seventh word line WL7, a reference word line on which a read operation is to be performed in a second memory block BLK2, determine, as a tenth word line WL10, a reference word line on which a read operation is to be performed in a third memory block BLK3, and determine, as a thirteenth word line WL13, a reference word line on which a read operation is to be performed in a fourth memory block BLK4.

The plurality of word lines WL1 to WL16 may be divided into a total of five word line zones Zone 1 to Zone 5 by the plurality of reference word lines WL4, WL7, WL10, and WL13. Specifically, a first word line zone Zone 1 among the plurality of word line zones Zone 1 to Zone 5 may include first to third word lines WL1 to WL3, a second word line zone Zone 2 among the plurality of word line zones Zone 1 to Zone 5 may include fifth and sixth word lines WL5 and WL6, a third word line zone Zone 3 among the plurality of word line zones Zone 1 to Zone 5 may include eighth and ninth word lines WL8 and WL9, a fourth word line zone Zone 4 among the plurality of word line zones Zone 1 to Zone 5 may include eleventh and twelfth word lines WL11 and WL12, and a fifth word line zone Zone 4 among the plurality of word line zones Zone 1 to Zone 5 may include fourteenth to sixteenth word lines WL14 to WL16.

When differences between numbers of word lines respectively included in the first to fifth word line zones Zone 1 to Zone 5 are calculated, a maximum difference value is calculated as 1. Thus, the differences between numbers of word lines respectively included in the plurality of word line zones Zone 1 to Zone 5 can be smallest by the plurality of reference word lines WL4, WL7, WL10, and WL13.

Accordingly, the plurality of reference word lines are determined through the above-described manner, so that a number of times a read operation on a word line is performed in the erase page search operation can be minimized.

Meanwhile, although a case where the plurality of reference word lines include the fourth word line WL4, the seventh word line WL7, the tenth word line WL10, and the thirteenth word line WL13 has been described in the above-described embodiment, the word lines included in the plurality of reference word lines may be variously modified.

After the plurality of reference word lines WL4, WL7, WL10, and WL13 are determined, the sudden power-off manager 210 may control the first to fourth memory blocks BLK1 to BLK4 to perform a read operation on each of the plurality of reference word lines WL4, WL7, WL10, and WL13 in the first to fourth memory blocks BLK1 to BLK4.

Specifically, the sudden power-off manager 210 may control the first to fourth memory blocks BLK1 to BLK4 to perform read operations on different reference word lines in the first to fourth memory blocks BLK1 to BLK4. For example, the sudden power-off manager 210 may control the first to fourth memory blocks BLK1 to BLK4 to perform a read operation on the fourth word line WL4 in the first memory block BLK1, to perform a read operation on the seventh word line WL7 in the second memory block BLK2, to perform a read operation on the tenth word line WL10 in the third memory block BLK3, and to perform a read operation on the thirteenth word line WL13 in the fourth memory block BLK4.

In the first memory block BLK1, a read voltage Vread may be applied to the fourth word line WL4, and a pass voltage Vpass may be applied to the other word lines. Similarly, in the second, third, and fourth memory blocks BLK2, BLK3, and BLK4, the read voltage may be applied to the seventh word line WL7, the tenth word line WL10, and the thirteenth word line WL13, and the pass voltage may be applied to the other word lines.

Also, the sudden power-off manager 210 may control the first to fourth memory blocks BLK1 to BLK4 to perform in parallel read operations on different reference word lines in the first to fourth memory blocks BLK1 to BLK4 according to an interleaving technique. The read operation on the fourth word line WL4 in the first memory block BLK1, the read operation on the seventh word line WL7 in the second memory block BLK2, the read operation on the tenth word line WL10 in the third memory block BLK3, and the read operation on the thirteenth word line WL13 may be performed in parallel.

Thus, the sudden power-off manager 210 controls the read operations of the plurality of reference word lines to be performed in parallel, so that the time required to perform the operations can be decreased.

In some implementations, by considering that the plurality of pages are sequentially programmed from the first page to the sixteenth page in the super block, when a specific page among the plurality of pages has been determined as programmed, it can be considered that a first erase page exists among pages whose page numbers are higher than that of the specific page. Also, when a specific page is determined as erased, it can be considered that a first erase page exists among pages whose page numbers are lower than that of the specific page.

In an embodiment, when it is determined that at least one program page and at least one erase page are included in a plurality of pages corresponding to the plurality of reference word lines, based on read data of each of the plurality of reference word lines, the sudden power-off manager 210 may determine a first erase page search zone among word line zones such that the first erase page search zone includes a reference word line corresponding to the program page and a reference word line corresponding to the erase page.

For example, the sudden power-off manager 210 may acquire read data about the plurality of reference word lines WL4, WL7, WL10, and WL13 respectively from the first to fourth memory blocks BLK1 to BLK4. The sudden power-off manager 210 may determine, as a program page, the fourth page Page 4 corresponding to the fourth word line WL4, and determine, as erase pages, the seventh page Page 7, the tenth page Page 10, and the thirteenth page Page 13, which respectively correspond to the seventh word line WL7, the tenth word line WL10, and the thirteenth word line WL13. Subsequently, since the pages corresponding to the plurality of reference word lines WL4, WL7, WL10, and WL13 include program pages (corresponding to the reference word line W4) and erase pages (corresponding to the reference word lines WL7, WL10, and WL13), the sudden power-off manager 210 may determine the second word line zone, Zone 2, as the first erase page search zone. The first erase page search zone is formed by the fourth word line WL4 corresponding to the fourth page, Page 4, which corresponds to the program page and the seventh word line WL7 corresponding to the seventh page, Page 7, which corresponds to the erase page.

Figure 6:
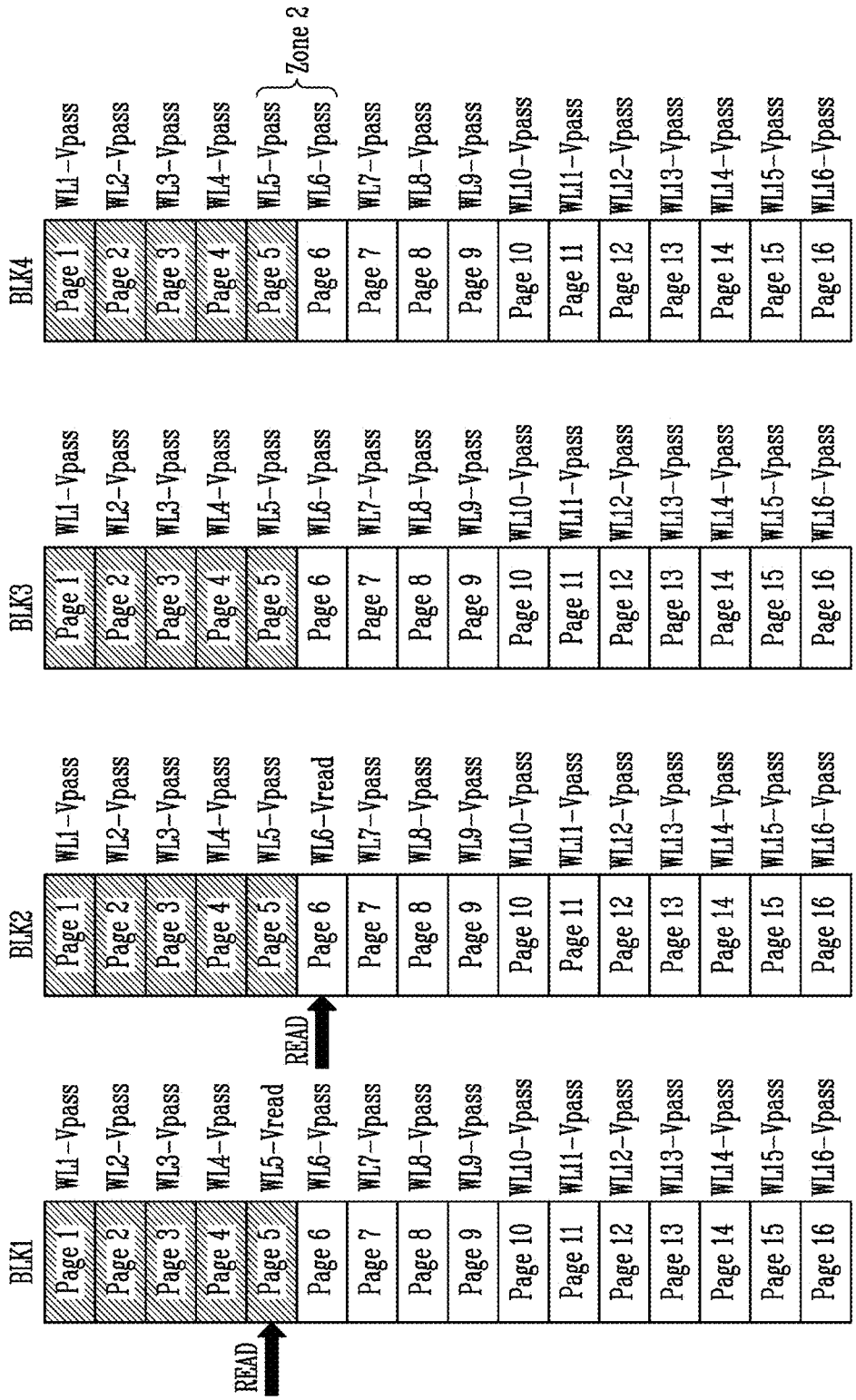
FIG. 6 is a diagram illustrating an example of determining a first erase page after the first erase page search zone shown in FIG. 5 is determined.

FIG. 6 is a diagram illustrating an example of determining a first erase page after the first erase page search zone shown in FIG. 5 is determined.

In FIG. 6, it is assumed that one super block includes four memory blocks BLK1 to BLK4 connected to 16 word lines WL1 to WL16, and each memory block includes 16 pages Page 1 to Page 16. However, such numbers, e.g., the number of each of the word lines, memory blocks, and the pages, are examples only and can be modified in some embodiments.

In an embodiment, the sudden power-off manager 210 may control a plurality of memory blocks to perform in parallel operations on a plurality of word lines included in a first erase page search zone in the plurality of memory blocks, and determine a first erase page, based on read data of each of the plurality of word lines included in the first erase page search zone.

In some implementations, the sudden power-off manager 210 may determine a first erase page in the second word line zone, Zone 2, which is determined as the first erase page search zone among the plurality of word line zones Zone 1 to Zone 5. The sudden power-off manager 210 may control the memory blocks BLK1 to BLK4 to perform a read operation on each of the fifth word line WL5 and the sixth word line WL6 included in the second word line zone Zone 2. For example, the sudden power-off manager 210 may control the memory blocks BLK1 to BLK4 to perform in parallel the read operation on the fifth word line WL5 in the first memory block BLK1 and the read operation on the sixth word line WL6 in the second memory block BLK2. In the first memory block BLK1, a read voltage may be applied to the fifth word line WL5, and a pass voltage may be applied to the other word lines. In the same manner, in the second memory block BLK2, the read voltage may be applied to the sixth word line WL6, and the pass voltage may be applied to the other word lines.

Subsequently, since, among the plurality of word lines included in the second word line zone Zone 2, the fifth word line WL5 corresponding to a program page and the sixth word line WL6 corresponding to an erase page are adjacent to each other, the sudden power-off manager 210 may determine, as a first erase page, the sixth page, Page 6, corresponding to the sixth word line WL6.

Figure 7:
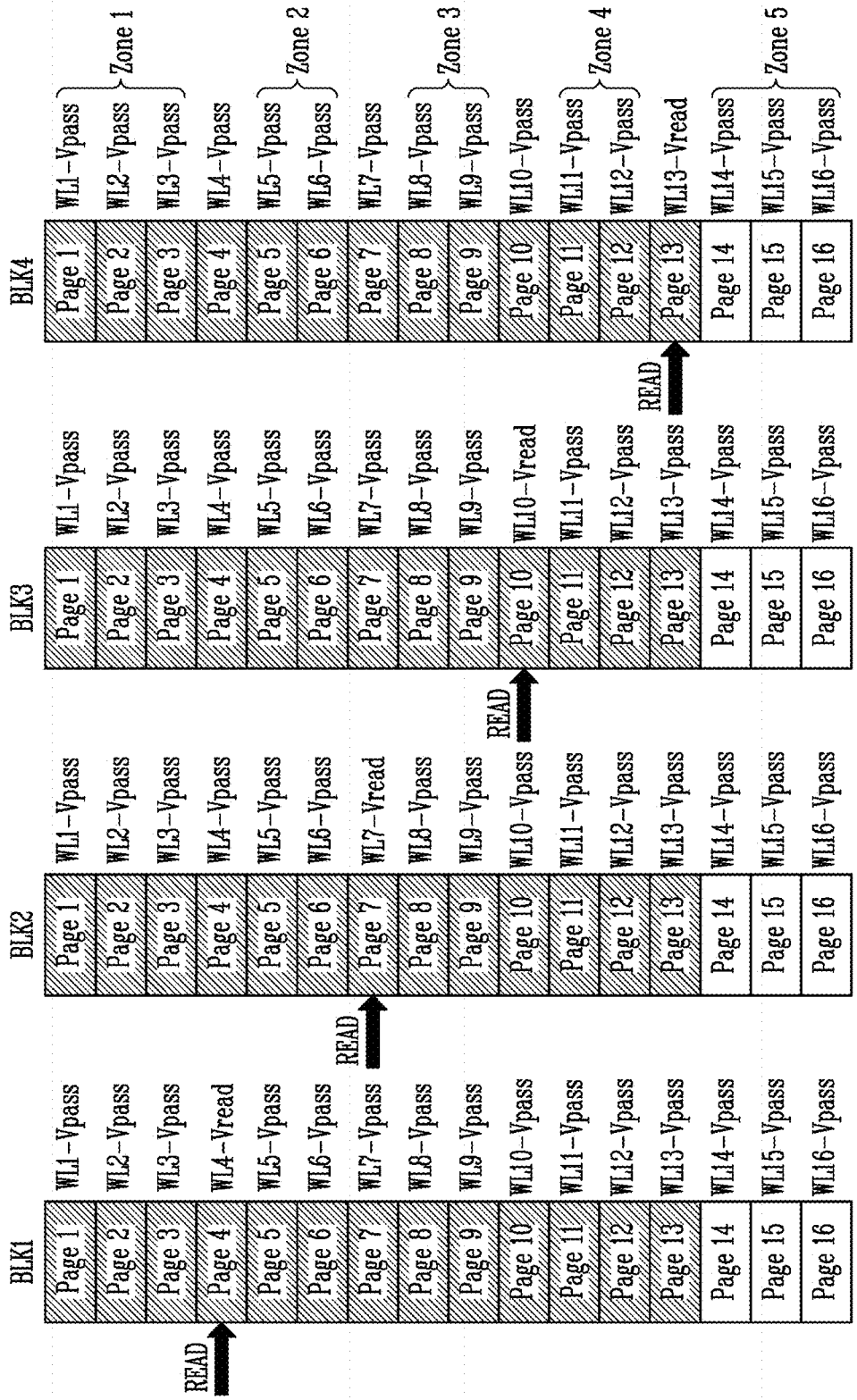
FIG. 7 is a diagram illustrating another example of determining a first erase page search zone in accordance with an embodiment of the disclosed technology.

FIG. 7 is a diagram illustrating another example of determining a first erase page search zone in accordance with an embodiment of the disclosed technology.

Unlike FIG. 5, it is assumed that first to thirteenth pages Page 1 to Page 13 included in a plurality of memory blocks BLK1 to BLK4 included in one super block shown in FIG. 7 are program pages, and fourteenth to sixteenth pages Page 14 to Page 16 are erase pages.

Referring to FIG. 7, upon performing read operations using reference word lines, all pages corresponding to a plurality of reference word lines are determined as program pages. In this case, the sudden power-off manager 210 may determine, among a plurality of word line zones, a first erase page search zone located at the lowermost end. Thus, the first erase page search zone is located after other word line zones along a line.

For example, the sudden power-off manager 210 may acquire read data of each of the plurality of reference word lines WL4, WL7, WL10, and WL13 from the first to fourth memory blocks BLK1 to BLK4 through a read operation on each of the plurality of reference word lines WL4, WL7, WL10, and WL13. In some implementations, the sudden power-off manager 210 may determine, as program pages, the fourth page Page 4, the seventh page Page 7, the tenth page Page 10, and the thirteenth page Page 13, which respectively correspond to the fourth word line WL4, the seventh word line WL7, the tenth word line WL10, and the thirteenth word line WL13. Since the pages respectively corresponding to the plurality of reference word lines WL4, WL7, WL10, and WL13 are all determined as the program pages, the sudden power-off manager 210 may determine, as a first erase page search zone, the fifth word line zone Zone 5 located at the lowermost end among the plurality of word line zones Zone 1 to Zone 5.

Figure 8:
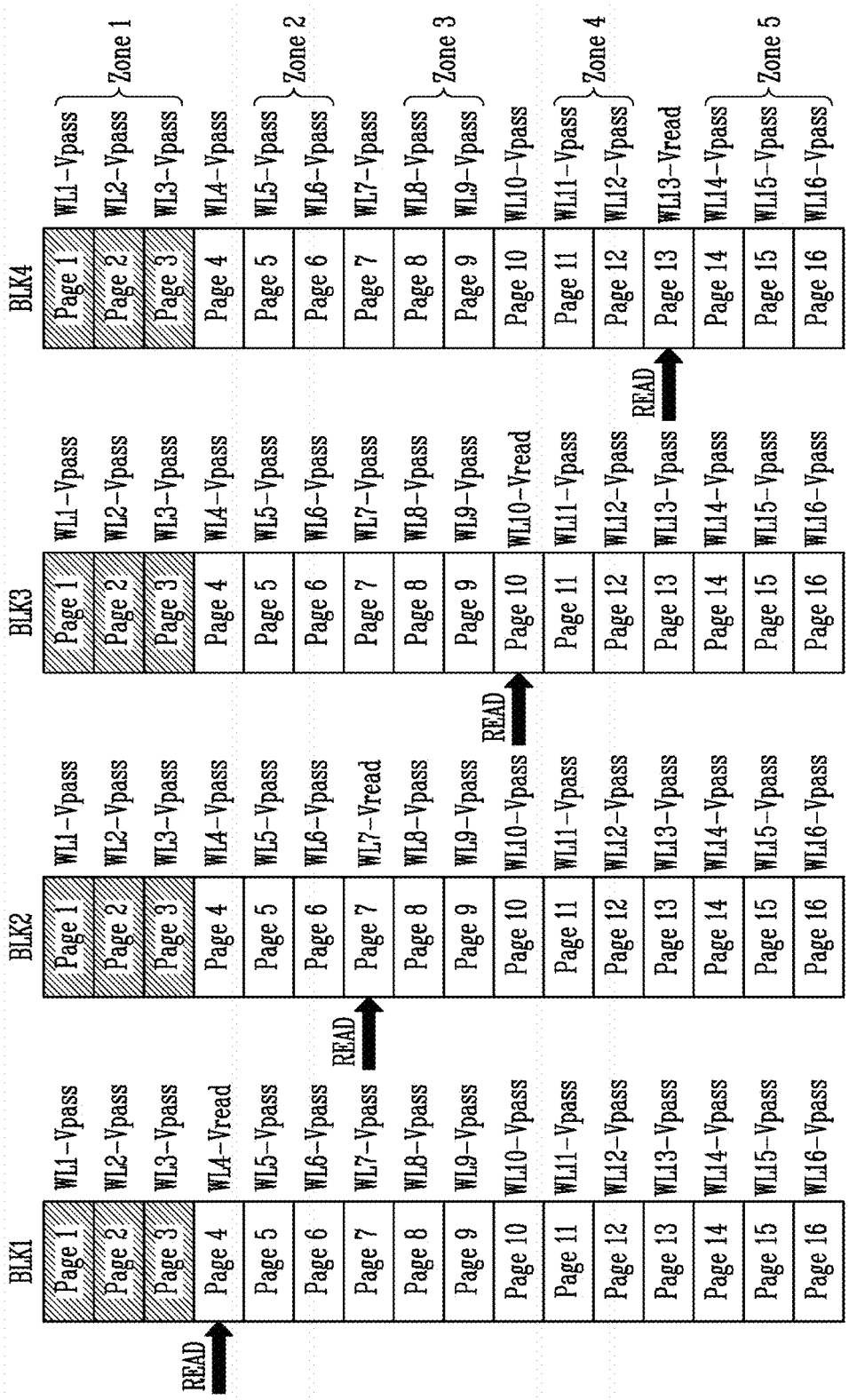
FIG. 8 is a diagram illustrating still another example of determining a first erase page search zone in accordance with an embodiment of the disclosed technology.

FIG. 8 is a diagram illustrating still another example of determining a first erase page search zone in accordance with an embodiment of the disclosed technology.

Unlike FIGS. 5 and 7, it is assumed that first to third pages Page 1 to Page 3 included in a plurality of memory blocks BLK1 to BLK4 included in one super block shown in FIG. 8 are program pages, and forth to sixteenth pages Page 4 to Page 16 are erase pages.

Referring to FIG. 8, upon performing read operations using reference word lines, all pages corresponding to a plurality of reference word lines are determined as erase pages. In this case, the sudden power-off manager 210 may determine, among a plurality of word line zones, a first erase page search zone located at the uppermost end. Thus, the first erase page search zone is located before other word line zones along a line.

For example, the sudden power-off manager 210 may acquire read data of each of the plurality of reference word lines WL4, WL7, WL10, and WL13 from the first to fourth memory blocks BLK1 to BLK4 through a read operation on each of the plurality of reference word lines WL4, WL7, WL10, and WL13. In some implementations, the sudden power-off manager 210 may determine, as erase pages, the fourth page Page 4, the seventh page Page 7, the tenth page Page 10, and the thirteenth page Page 13, which respectively correspond to the fourth word line WL4, the seventh word line WL7, the tenth word line WL10, and the thirteenth word line WL13. Since the pages respectively corresponding to the plurality of reference word lines WL4, WL7, WL10, and WL13 are all determined as the erase pages, the sudden power-off manager 210 may determine, as a first erase page search zone, the first word line zone Zone 1 located at the uppermost end among the plurality of word line zones Zone 1 to Zone 5.

Figure 9:
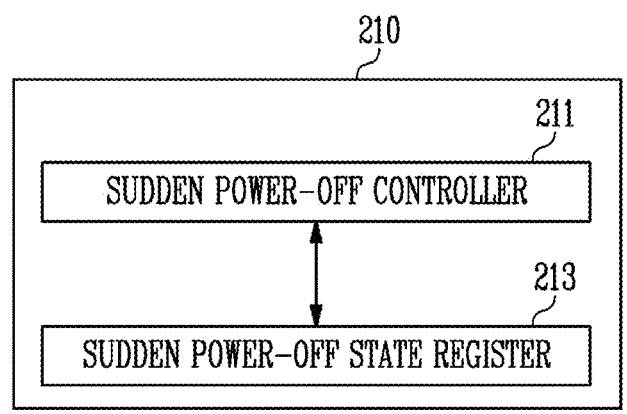
FIG. 9 is a diagram illustrating a sudden power-off manager in accordance with an embodiment of the disclosed technology.

FIG. 9 is a diagram illustrating a sudden power-off manager in accordance with an embodiment of the disclosed technology.

Referring to FIG. 9, the sudden power-off manager 210 may include a sudden power-off controller 211 and a sudden power-off state register 213.

The sudden power-off controller 211 may detect sudden power off, and perform an erase page search operation when power is supplied again after the occurrence of the sudden power off.

For example, the sudden power-off controller 211 may perform the erase page search operation described in FIGS. 5 to 8.

In an embodiment, when a first erase page is determined through the erase page search operation, the sudden power-off controller 211 may control a plurality of memory blocks to perform a dummy write operation on the first erase page in the plurality of memory blocks.

The sudden power-off state register 213 may store sudden power-off state information associated with the sudden power off.

For example, the sudden power-off state information may include whether the sudden power-off has occurred, etc.

Figure 10A:
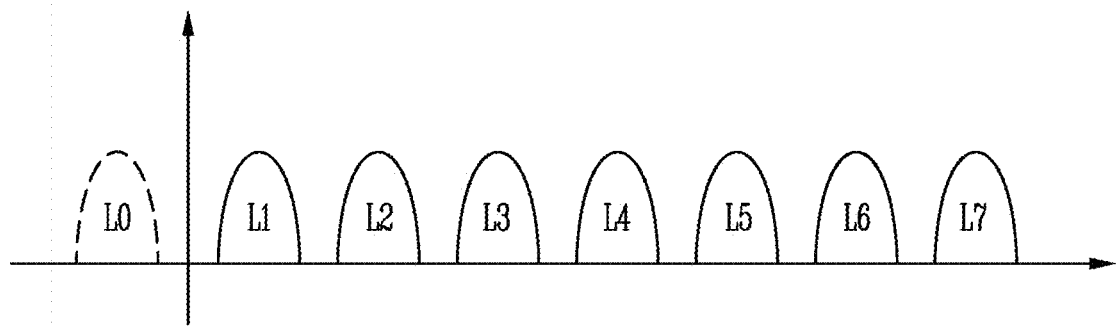
FIG. 10A is a diagram illustrating a voltage distribution of a triple level cell in a read operation.
Figure 10B:
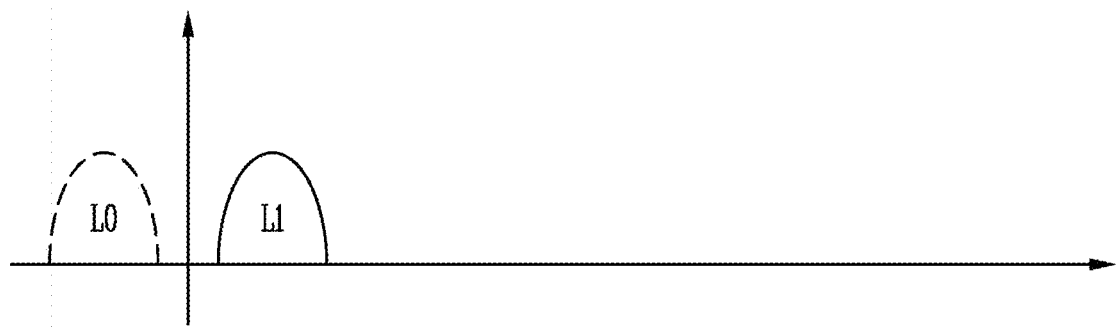
FIG. 10B is a diagram illustrating a voltage distribution of a single level cell in the read operation.

FIG. 10A is a diagram illustrating a voltage distribution of a triple level cell in a read operation. FIG. 10B is a diagram illustrating a voltage distribution of a single level cell in the read operation.

Referring to FIGS. 10A and 10B, in a triple level cell mode, read voltages from level 1 to level 7 are to be applied in the read operation. Alternatively, in a single level cell mode, a read voltage of the level 1 is applied in the read operation.

Therefore, a read operation speed in the single level cell mode is faster than that in the triple level cell mode. In addition, in an erase page search operation for identifying whether a page is a program page or an erase page, it may be determined whether the corresponding page is to be programmed or erased, through only a read operation in a single level cell unit.

In an embodiment, in a read operation on a plurality of reference word lines, the sudden power-off manager 210 may change the mode of a plurality of memory blocks to the single level cell mode, and control the plurality of memory blocks to perform the read operation in the single level cell unit on each of the plurality of reference word lines.

Accordingly, the sudden power-off manager 210 performs the read operation in the single level cell unit, so that the speed of the erase page search operation can be improved.

Figure 11:
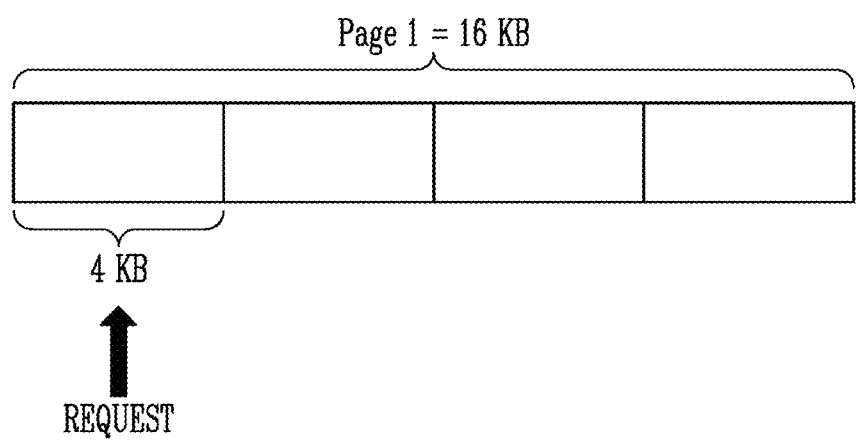
FIG. 11 is a diagram illustrating another example of a read operation in accordance with an embodiment of the disclosed technology.

FIG. 11 is a diagram illustrating another example of a read operation in accordance with an embodiment of the disclosed technology.

Referring to FIG. 11, one page may be divided to be programmed. For example, the one page may store data by performing a program operations four times, i.e., through a four-time program. A size of data stored in the one page by performing a single program operation, i.e., through a one-time program, may be ¼ of that of data stored in the one page. For example, when assuming that the size of the data stored in the one page is 16 KB, the size of the data stored by the one-time program may be 4 KB.

In an embodiment, the sudden power-off manager 210 may request some of read data of each of a plurality of reference word lines in a read operation on each of the plurality of reference word lines.

As described above, since data is divided to be stored in the one page, it can be determined whether the one page is a program page or an erase page even when only some of data read from the one page are output. Thus, the sudden power-off manager 210 requests only some of read data of a reference word line, to determine whether a page corresponding to the reference word line is a program page or an erase page.

Accordingly, in the storage device 50 in accordance with the embodiment of the disclosed technology, the speed of the erase page search operation can be improved through the above-described read operation.

Figure 12A:
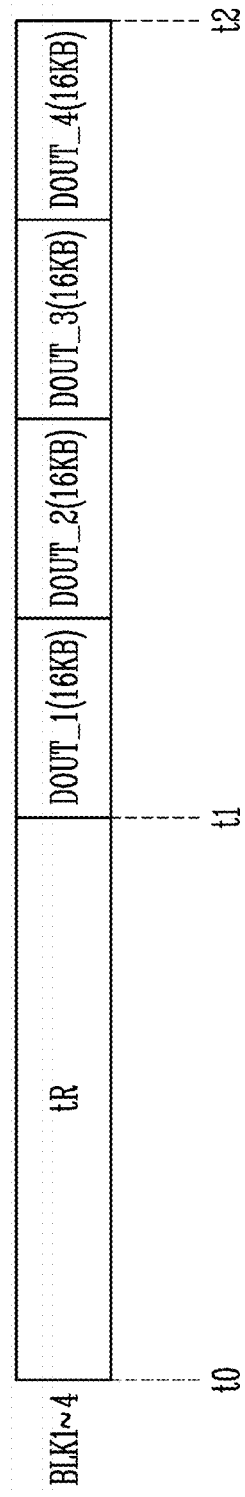
FIG. 12A is a diagram illustrating a time required in an erase page search operation in accordance with a conventional art.

FIG. 12A is a diagram illustrating a time required in an erase page search operation in accordance with a conventional art. For example, in the conventional art, an erase page may be searched by using a binary search method.

Figure 12B:
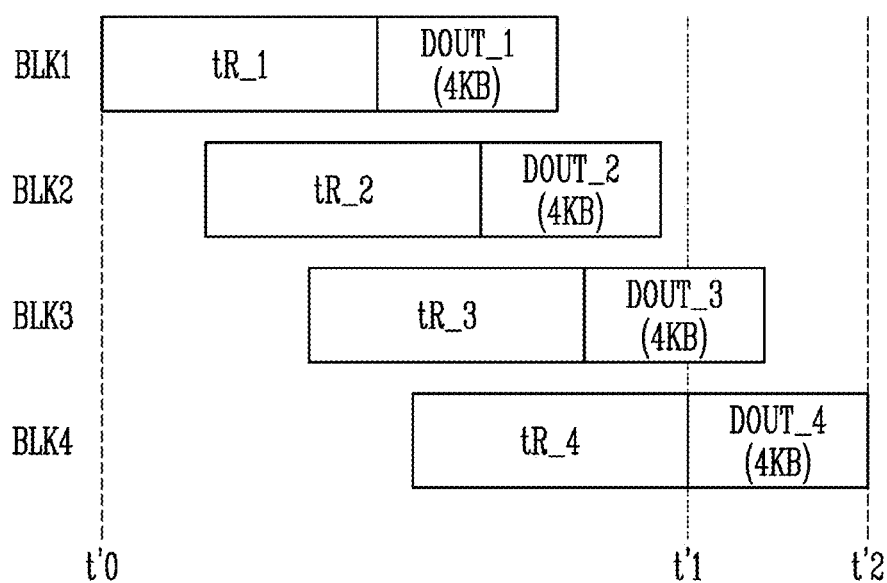
FIG. 12B is a diagram illustrating a time required in the erase page search operation in accordance with an embodiment of the disclosed technology.

FIG. 12B is a diagram illustrating a time required in the erase page search operation in accordance with an embodiment of the disclosed technology.

Referring to FIGS. 12A and 12B, in the conventional art, a plurality of memory blocks perform a read operation using the same word lines and output the entire data read from one page in the erase page search operation, which makes the time required in the erase page search operation long.

On the other hand, in accordance with the embodiment of the disclosed technology, the storage device 50 performs read operations in parallel such that the read operations of the respective memory blocks are performed using different word lines in the erase page search operation, so that the time required in the read operation can be reduced.

Also, in accordance with the embodiment of the disclosed technology, the storage device 50 requests only some of data read from one page, so that the size of output data is decreased. Accordingly, the time required in the erase page search operation can be reduced.

FIG. 13 is a flowchart illustrating an operating method of a storage device in accordance with an embodiment of the disclosed technology.

The method shown in FIG. 13 may be performed by, for example, the storage device 50 shown in FIG. 1.

In step S1301, the storage device 50 detects sudden power off.

In step S1303, the storage device 50 performs a read operation on or using each of a plurality of reference word lines that are used as references to divide a plurality of word lines connected to a plurality of memory blocks into a plurality of word line zones.

There can be multiple ways to determine reference word lines. For example, the plurality of reference word lines may be determined as word lines such that differences between numbers of word lines included in the respective word line zones becomes smallest.

In an embodiment, the storage device 50 may perform read operations on or using different reference word lines in each of the plurality of memory blocks. For example, the storage device 50 may perform in parallel read operations on different reference word lines in each of the plurality of memory blocks according to an interleaving technique.

The storage device 50 may request some of read data of each of the plurality of reference word lines.

The storage device 50 may change the mode of the plurality of memory blocks to a single level cell mode, and perform a read operation in a single level cell unit on each of the plurality of reference word lines.

In step S1305, the storage device 50 determines a first erase page search zone. The first erase page search zone is a target zone to be searched for determining a first erase page located at a boundary between a program page and an erase page. A method for determining the first erase page search zone in the step S1305 will be described in detail in description shown in FIG. 14.

In step S1307, the storage device 50 may determine whether a first erase page is to be determined.

In some implementations, the storage device 50 may re-determine different reference word lines of each of the plurality of memory blocks in the first erase page search zone. The storage device 50 may perform read operations on or using the re-determined reference word lines in each of the plurality of memory blocks, and determine whether a first erase page is to be determined, based on read data of each of the re-determined reference word lines.

When the first erase page is to be determined according to a determination result in the step S1307, in step S1309, the storage device 50 determines a first erase page in the first erase page search zone.

When the first erase page is not to be determined according to a determination result in the step S1307, the storage device 50 may repeatedly perform the steps S1303, S1305, and S1307 until the first erase page is determined. That is, the storage device 50 may repeatedly perform an erase page search operation until the first erase page is determined.

Whenever an erase page search operation is repeatedly performed, the storage device 50 may re-determine a reference word line of each of the plurality of memory blocks in a first erase page search zone determined in a previous erase page search operation, and perform the erase page search operation, based on the re-determined reference word line. For example, when the storage device 50 performs an (i+1)th erase page search operation, the storage device 50 may re-determine a reference word line of each of the plurality of memory blocks in a first erase page search zone determined in an ith erase page search operation, and perform the (i+1)th erase page search operation, based on the re-determined reference word line.

A method for determining a first erase page in the steps S1307 and S1309 will be described in detail in description shown in FIG. 15 which will be described later.

FIG. 14 is a flowchart illustrating a method for determining a first erase page search zone in accordance with an embodiment of the disclosed technology.

The method shown in FIG. 14 may be performed by, for example, the storage device 50 shown in FIG. 1. In addition, steps shown in FIG. 14 may correspond to the step S1305 shown in FIG. 13.

In step S1401, the storage device 50 may determine whether at least one program page and at least one erase page are included in a plurality of pages corresponding to a plurality of reference word lines, based on read data of each of the plurality of reference word lines.

When it is determined that the at least one program page and the at least one erase page are included in the plurality of pages corresponding to the plurality of reference word lines according to a determination result in the step S1401, in step S1403, the storage device 50 may determine, as a first erase page search zone, a zone formed by a reference word line corresponding to the program page and a reference word line corresponding to the erase page.

On the other hand, when it is determined that only one of the program page and the erase page is included in the plurality of pages corresponding to the plurality of reference word lines according to a determination result in the step S1401, in step 1405, the storage device 50 may determine whether the plurality of pages corresponding to the plurality of reference word lines are all program pages, based on the read data of each of the plurality of reference word lines.

When the plurality of pages corresponding to the plurality of reference word lines are all program pages according to a determination result in the step S1405, in step S1407, the storage device 50 may determine, as a first erase page search zone, a zone located at the lowermost end among the plurality of word line zones.

On the other hand, when the plurality of pages corresponding to the plurality of reference word lines are not all program pages according to a determination result in the step S1405, in step S1409, the storage device 50 may determine, as the first erase page search zone, a zone located at the uppermost end among the plurality of word line zones. That is, when it is determined that the plurality of pages corresponding to the plurality of reference word lines are all erase pages, the storage device 50 may determine, as the first erase page search zone, a zone located at the uppermost end among the plurality of word line zones.

Figure 15:
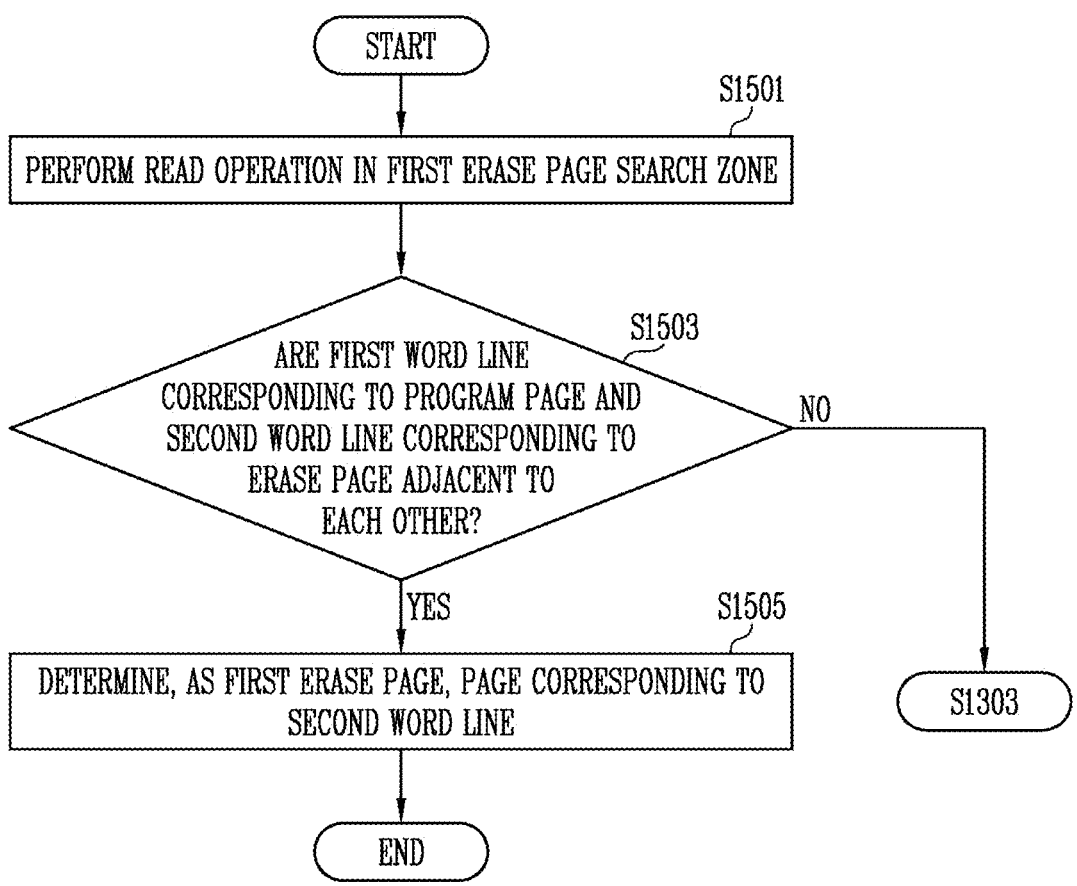
FIG. 15 is a flowchart illustrating a method for determining a first erase page search zone in accordance with an embodiment of the disclosed technology.

FIG. 15 is a flowchart illustrating a method for determining a first erase page search zone in accordance with an embodiment of the disclosed technology.

The method shown in FIG. 15 may be performed by the storage device 50 shown in FIG. 1. In addition, steps shown in FIG. 15 may correspond to the steps S1307 and S1309 shown in FIG. 13.

In step S1501, the storage device 50 may perform a read operation on each of a plurality of word lines included in a first erase page search zone in a plurality of memory blocks.

Specifically, the storage device 50 may re-determine a reference word line in each of the plurality of memory blocks in the first erase page search zone. Also, the storage device 50 may perform a read operation on the reference word line re-determined in each of the plurality of memory blocks.

In step S1503, the storage device 50 may determine whether a first word line corresponding to a program page and a second word line corresponding to an erase page among the plurality of word lines included in the first erase page search zone are adjacent to each other, based on read data of each of the plurality of word lines included in the first erase page search zone.

Specifically, the storage device 50 may determine whether the first word line corresponding to the program page and the second word line corresponding to the erase page among the re-determined reference word lines are adjacent to each other, based on read data of each of the re-determined reference word lines.

When the first word line and the second word line are adjacent to each other according to a determination result in the step S1503, in step S1505, the storage device 50 may determine, as a first erase page, a page corresponding to the second word line.

On the other hand, when the first word line and the second word line are not adjacent to each other according to a determination result in the step S1503, the storage device 50 may again perform the step S1303 shown in FIG. 13.

Figure 16:
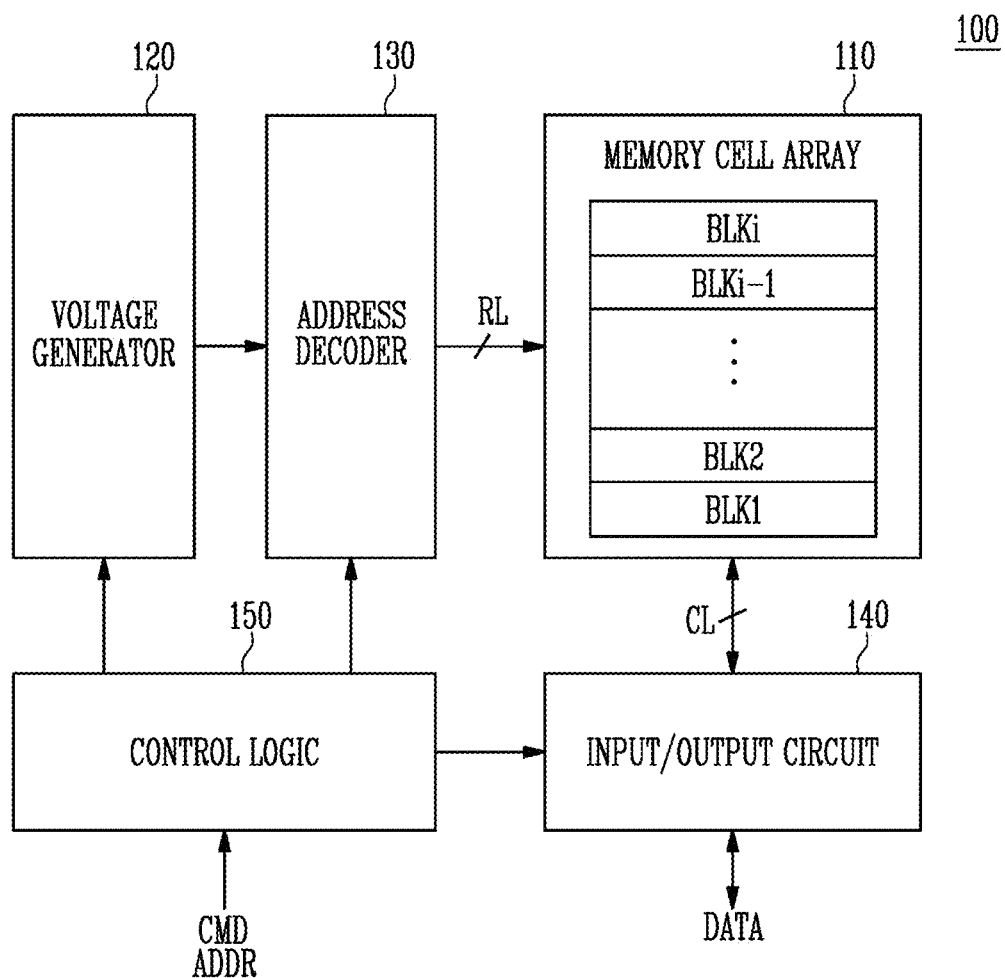
FIG. 16 is a diagram illustrating a memory device shown in FIG. 1.

FIG. 16 is a diagram illustrating the memory device shown in FIG. 1.

Referring to FIG. 16, the memory device 100 may include a memory cell array 110, a voltage generator 210, an address decoder 130, an input/output circuit 140, and a control logic 150.

The memory cell array 110 includes a plurality of memory blocks BLK1 to BLKi. The plurality of memory blocks BLK1 to BLKi are connected to the address decoder 130 through row lines RL. The plurality of memory blocks BLK1 to BLKi may be connected to the input/output circuit 140 through column lines CL. In an embodiment, the row lines RL may include word lines, source select lines, and drain select lines. In an embodiment, the column lines CL may include bit lines.

Each of the plurality of memory blocks BLK1 to BLKi includes a plurality of memory cells. In an embodiment, the plurality of memory cells may be nonvolatile memory cells. Memory cells connected to the same word line among the plurality of memory cells may be defined as one physical page. That is, the memory cell array 110 may include a plurality of physical pages. Each of the memory cells of the memory device 100 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

In an embodiment, the voltage generator 120, the address decoder 130, and the input/output circuit 140 may be collectively referred to as a peripheral circuit. The peripheral circuit may drive the memory cell array 110 under the control of the control logic 150. The peripheral circuit may drive the memory cell array 110 to perform a program operation, a read operation, and an erase operation.

The voltage generator 120 generates a plurality of operation voltages by using an external power voltage supplied to the memory device 100. The voltage generator 120 operates under the control of the control logic 150.

In an embodiment, the voltage generator 120 may generate an internal power voltage by regulating the external power voltage. The internal power voltage generated by the voltage generator 120 is used as an operation voltage of the memory device 100.

In an embodiment, the voltage generator 120 may generate a plurality of operation voltages by using the external power voltage or the internal power voltage. The voltage generator 120 may generate various voltages required in the memory device 100. For example, the voltage generator 120 may generate a plurality of erase voltages, a plurality of program voltages, a plurality of pass voltages, a plurality of select read voltages, and a plurality of unselect read voltages.

In order to generate a plurality of operation voltages having various voltage levels, the voltage generator 120 may include a plurality of pumping capacitors for receiving the internal power voltage, and generate the plurality of operation voltages by selectively activating the plurality of camping capacitors under the control of the control logic 150.

The plurality of generated operation voltages may be supplied to the memory cell array 110 by the address decoder 130.

The address decoder 130 is connected to the memory cell array 110 through the row lines RL. The address decoder 130 operates under the control of the control logic 150. The address decoder 130 may receive an address ADDR from the control logic 150. The address decoder 130 may decode a block address in the received address ADDR. The address decoder 130 may select at least one memory block among the memory blocks BLK1 to BLKi according to the decoded block address. The address decoder 130 may decode a row address in the received address ADDR. The address decoder 130 may select at least one word line among word lines of the selected memory block according to the decoded row address. In an embodiment, the address decoder 130 may decode a column address in the received address ADDR. The address decoder 130 may connect the input/output circuit 140 and the memory cell array 110 according to the decoded column address.

In accordance with an embodiment of the disclosed technology, in a read operation, the address decoder 130 may apply a read voltage to the selected word line, and apply a read pass voltage having a level higher than that of the read voltage to unselected word lines.

Exemplarily, the address decoder 130 may include components such as a row decoder, a column decoder, and an address buffer.

The input/output circuit 140 may include a plurality of page buffers. The plurality of page buffers may be connected to the memory cell array 110 through the bit lines. In a program operation, data may be stored in selected memory cells according to the data stored in the plurality of page buffers.

In a read operation, the data stored in the selected memory cells may be sensed through the bit lines, and the sensed data may be stored in the page buffers.

The control logic 150 may control the address decoder 130, the voltage generator 120, and the input/output circuit 140. The control logic 150 may operate in response to a command CMD transferred from an external device. The control logic 150 may control the peripheral circuit by general various signals in response to the command CMD and the address ADDR.

Figure 17:
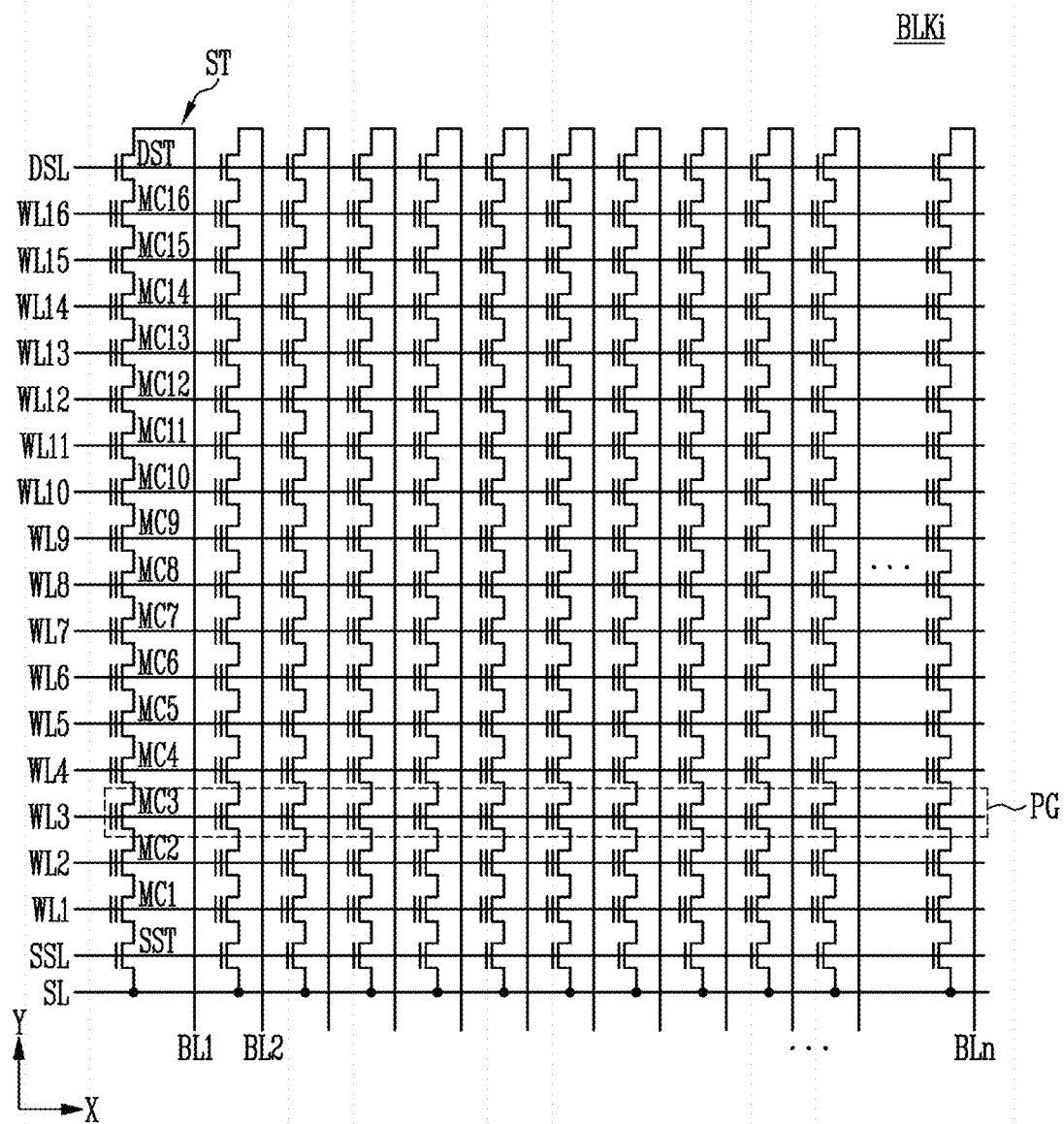
FIG. 17 is a diagram illustrating a structure of any one memory block among memory blocks shown in FIG. 16.

FIG. 17 is a diagram illustrating a structure of any one memory block among memory blocks shown in FIG. 16.

The memory block BLKi is a diagram illustrating any one memory block BLKi among the memory blocks BLK1 to BLKi shown in FIG. 16.

Referring to FIG. 17, in the memory block BLKi, a plurality of word lines may be arranged in parallel to each other between a first select line and a second select line. The first select line may be a source select line SSL, and the second select line may be a drain select line DSL. More specifically, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells MC1 to MC16, and a drain select transistor DAT, which are connected in series to each other between the source line SL and the first bit line BL1. At least one source select transistor SST and at least one drain select transistor DST may be included in one string ST, and memory cells of which number is greater than that of the memory cells MC1 to MC16 shown in the drawing may be included in the one string ST.

A source of the source select transistor SST may be connected to the source line SL, and a drain of the drain select transistor DAT may be connected to the first bit line BL1. The memory cells MC1 to MC16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells MC1 to MC16 may be connected to a plurality of word lines WL1 to WL16. A group of memory cells connected to the same word line among memory cells included in different strings ST may be referred to as a physical page PG. Therefore, physical pages PG corresponding to the number of the word lines WL1 to WL16 may be included in the memory block BLKi.

One memory cell may store one-bit data. The one memory cell is generally referred to as a single level cell (SLC). One physical page PG may store one logical page (LPG) data. One LPG data may include data bits corresponding to the number of cells included in the one physical page PG.

One memory cell may store two or more-bit data. One physical page PG may store two or more LPG data.

Figure 18:
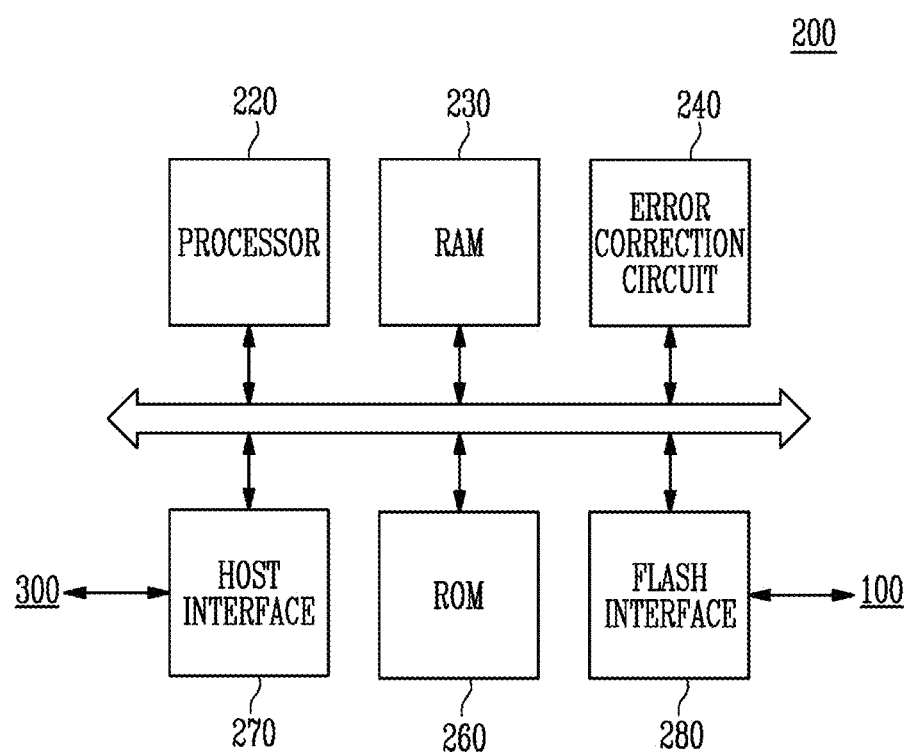
FIG. 18 is a diagram illustrating the memory controller shown in FIG. 1.

FIG. 18 is a diagram illustrating the memory controller shown in FIG. 1.

Referring to FIGS. 1 and 18, the memory controller 200 may include a processor 220, a RAM 230, an error correction circuit 240, ROM 250, a host interface 270, and a flash interface 280.

The processor 220 may control overall operations of the memory controller 200. The RAM 230 may be used as a buffer memory, a cache memory, a working memory, etc. of the memory controller 200.

The ROM 260 may store, in the form of firmware, various information required in an operation of the memory controller 200. In an embodiment, the sudden power-off manager 210 described with reference to FIG. 1 may be firmware stored in the ROM 260.

The memory controller 200 may communicate with an external device (e.g., the host 300, an application processor, or the like) through the host interface 270.

The memory controller 200 may communicate with the memory device 100 through the flash interface 280. The memory controller 200 may transmit a command CMD, an address ADDR, a control signal CTRL, and the like to the memory device 100 through the flash interface 280, and receive data DATA. Exemplarily, the flash interface 280 may include a NAND interface.

Figure 19:
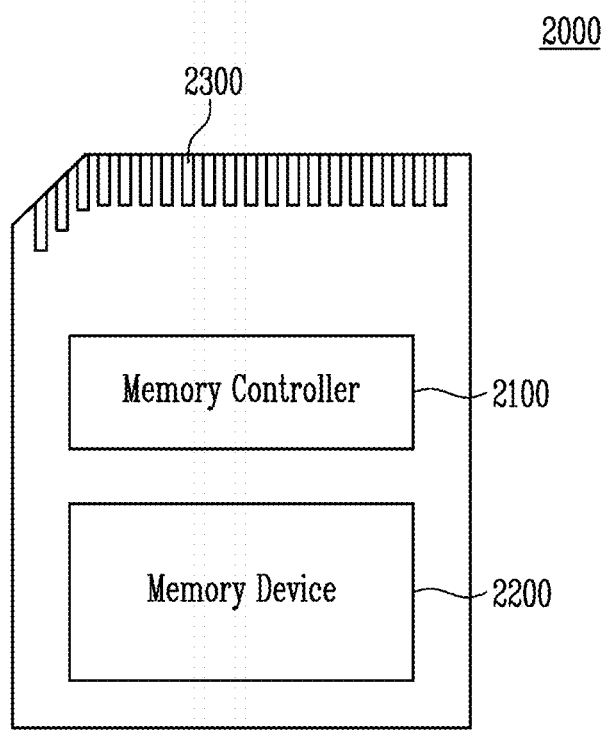
FIG. 19 is a block diagram illustrating a memory card system to which the storage device is applied in accordance with an embodiment of the disclosed technology.

FIG. 19 is a block diagram illustrating a memory card system to which the storage device is applied in accordance with an embodiment of the disclosed technology.

Referring to FIG. 19, the memory card system 2000 includes a memory controller 2100, a memory device, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1.

Exemplarily, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

Exemplarily, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 20:
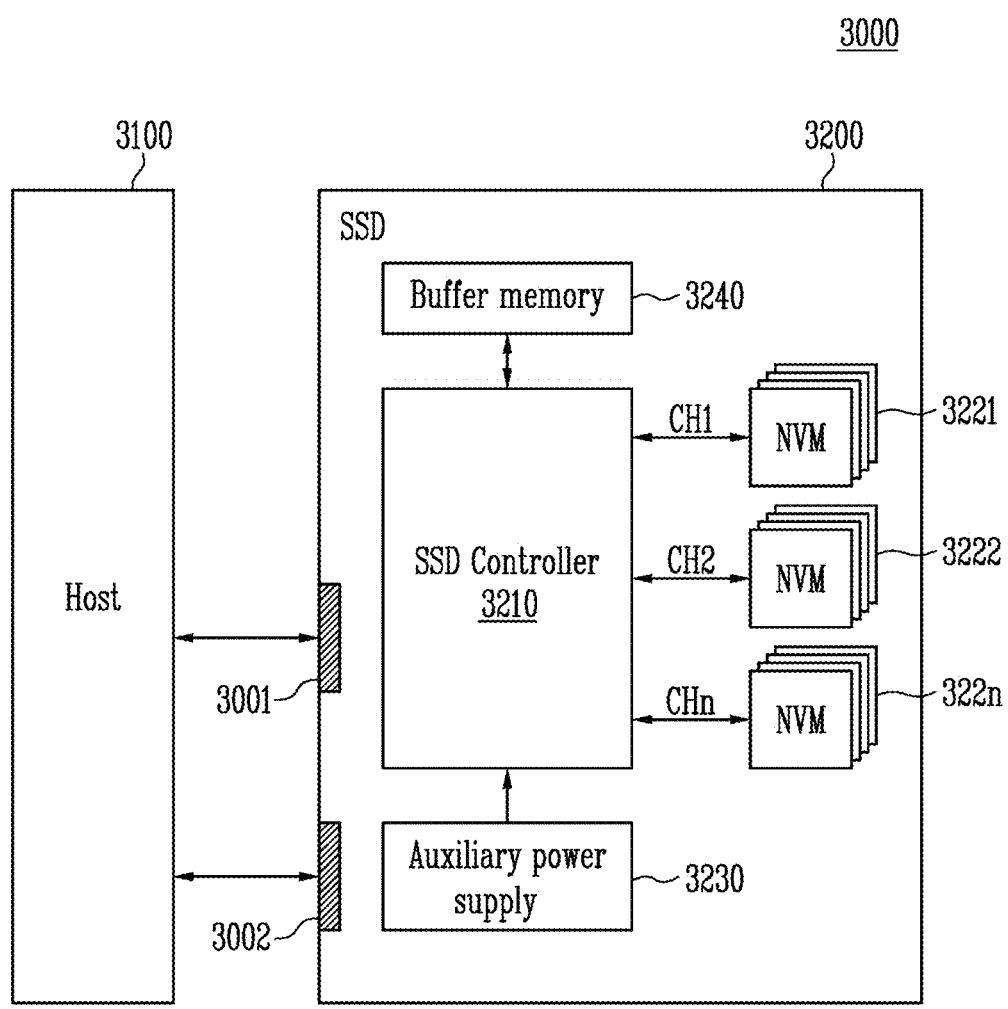
FIG. 20 is a block diagram exemplarily illustrating a Solid State Drive (SSD) system to which the storage device is applied in accordance with an embodiment of the disclosed technology.

FIG. 20 is a block diagram exemplarily illustrating a Solid State Drive (SSD) system to which the storage device is applied in accordance with an embodiment of the disclosed technology.

Referring to FIG. 20, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 21:
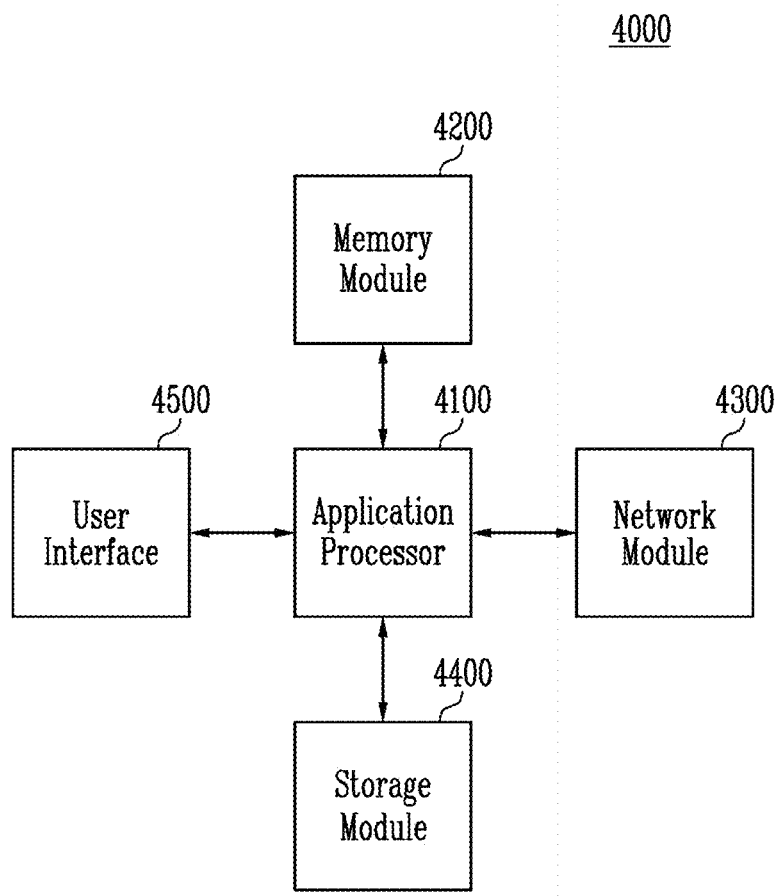
FIG. 21 is a block diagram illustrating a user system to which the storage device is applied in accordance with an embodiment of the disclosed technology.

FIG. 21 is a block diagram illustrating a user system to which the storage device is applied in accordance with an embodiment of the disclosed technology.

Referring to FIG. 21, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

Exemplarily, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the disclosed technology, there can be provided a storage device having an improved operation speed and an operating method thereof.

While the disclosed technology has been shown and described with reference to certain exemplary embodiments thereof, it will be understood by those skilled in the art that various changes in form and details may be made. In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the disclosed technology, and the disclosed technology is not limited thereto. It should be apparent to those skilled in the art that various modifications can be made.

What is claimed is:

1. A storage device comprising:
    a plurality of memory blocks that is included in a super block and connected to a plurality of word lines; and
    a sudden power-off manager in communication with the plurality of memory blocks and configured to, in response to a sudden power off, 1) select reference word lines among the plurality of word lines to group the plurality of word lines into a plurality of word line zones defined using the reference word lines, 2) determine different word lines as the reference word lines for each of the plurality of memory blocks, 3) perform read operations on pages connected to the reference word lines to determine states of the pages connected to the reference word lines, 4) select a first erase page search zone among the plurality of word line zones based on results of the read operations, and 5) determine a first erase page located at a boundary between a program page and an erase page in the first erase page search zone.

2. The storage device of claim 1, wherein the plurality of reference word lines is selected such that differences between numbers of word lines included in the plurality of word line zones become smallest.

3. The storage device of claim 1, wherein the sudden power-off manager includes:
    a sudden power-off controller configured to detect the sudden power off, and perform operations 1) to 4) when power is supplied after an occurrence of the sudden power off; and
    a sudden power-off state register configured to store sudden power-off state information associated with the sudden power off.

4. The storage device of claim 1, wherein the sudden power-off manager is configured to control two or more of the plurality of memory blocks such that the read operations are performed in the two or more of the plurality of memory blocks using different reference word lines.

5. The storage device of claim 4, wherein the sudden power-off manager is configured to control the two or more of the plurality of memory blocks to concurrently perform the read operations in the two or more of the plurality of memory blocks.

6. The storage device of claim 1, wherein in case that the results of the read operations indicate that the pages connected to the reference word lines include a first page having a program state and connected to a first reference word line and a second page having a erase state and connected to a second reference word line, the sudden power-off manager is configured to select the first erase page search zone such that the first erase page search zone is located between the first reference word line and the second reference word line.

7. The storage device of claim 1, wherein in case that the results of the read operations indicate that all of the pages connected to the reference word lines have a program state, the sudden power-off manager is configured to select the first erase page search zone such that the first erase page search zone is located after other word line zones along a line.

8. The storage device of claim 1, wherein in case that the results of the read operations indicate that all of the pages connected to the reference word lines have an erase state, the sudden power-off manager is configured to select the first erase page search zone such that the first erase page search zone is located before other word line zones along a line.

9. The storage device of claim 1, wherein the sudden power-off manager is configured to control the plurality of memory blocks to perform additional read operations on pages connected to word lines included in the first erase page search zone, and determine the first erase page based on the additional read operations.

10. The storage device of claim 9, wherein the first erase page has an erase state and located adjacent to another page having a program state, and the first erase page and the another page are connected to word lines that are sequentially arranged.

11. The storage device of claim 1, wherein the sudden power-off manager is configured to request parts of read data obtained from the read operations.

12. The storage device of claim 1, wherein the sudden power-off manager is configured to change a mode of at least one of the plurality of memory blocks to a single level cell mode, and control the at least one of the plurality of memory blocks to perform the read operations in a single level cell unit.

13. A memory controller for controlling a memory device including a plurality of memory blocks that is included in a super block and connected to a plurality of word lines, the memory controller comprising:

a sudden power-off controller in communication with the plurality of memory blocks and configured to, in response to a sudden power off, 1) select reference word lines among the plurality of word lines to group the plurality of word lines into a plurality of word line zones that are defined using the reference word lines, 2) determine different word lines as the reference word lines for each of the plurality of memory blocks, 3) perform read operations on pages included in the plurality of memory blocks and connected to the reference word lines to determine states of the pages, 4) select a first erase page search zone among the plurality of word line zones based on results of the read operations, and 5) determine a first erase page located at a boundary between a program page and an erase page in the first erase page search zone; and a sudden power-off state register coupled to and in communication with the sudden power-off controller and configured to store sudden power-off state information associated with the sudden power off.

14. The memory controller of claim 13, wherein the plurality of reference word lines is selected such that differences between numbers of word lines included in the plurality of word line zones become smallest.

15. The memory controller of claim 13, wherein the sudden power-off controller is configured to request a part of read data of each of the plurality of reference word lines.

16. The memory controller of claim 13, wherein the sudden power-off controller is configured to change a mode of at least one of the plurality of memory blocks to a single level cell mode, and control the at least one of the plurality of memory blocks to perform the read operations in a single level cell unit.

17. A method for operating a storage device that controls an operation of a super block including a plurality of memory blocks connected to a plurality of word lines, the method comprising:

detecting an occurrence of sudden power-off that interrupts a supply of power to the storage device;

selecting reference word lines among the plurality of word lines to group the plurality of word lines into word line zones that are defined using the reference word lines;

determining different word lines as the reference word lines for each of the plurality of memory blocks;

performing read operations on pages connected to the reference word lines to determine a states of each of the pages connected to the reference word lines as a erase state or a program state;

selecting a first erase page search zone among the word line zones; and determining a first erase page located at a boundary between a program page and an erase page in the first erase page search zone.

18. The method of claim 17, wherein the plurality of reference word lines are selected such that differences between numbers of word lines included in the plurality of word line zones become smallest.

19. The method of claim 17, wherein the performing of the read operation includes requesting some of read data obtained from the read operations.

20. The method of claim 17, wherein the performing of the read operation includes:

changing modes of the plurality of memory blocks to a single level cell mode, and performing the read operations in a single level cell unit on each of the plurality of memory blocks.

\* \* \* \* \*